(12) United States Patent
Chang et al.

(10) Patent No.: US 11,177,807 B2
(45) Date of Patent: Nov. 16, 2021

(54) CIRCUIT, METHOD FOR SIZING AN ASPECT RATIO OF TRANSISTORS OF A CIRCUIT, AND CIRCUIT ARRANGEMENT

(71) Applicant: Nanyang Technological University, Singapore (SG)

(72) Inventors: Joseph Sylvester Chang, Singapore (SG); Kwen Siong Chong, Singapore (SG); Ne Kyaw Zwa Lwin, Singapore (SG); Sivaramakrishnan Hariharakrishnan, Singapore (SG)

(73) Assignee: ZERO-ERROR SYSTEMS PTE LTD, Singapore (SG)

( * ) Notice: Subject to any disclaimer, the term of this patent is extended or adjusted under 35 U.S.C. 154(b) by 0 days.

(21) Appl. No.: 16/963,798

(22) PCT Filed: Jan. 22, 2019

(86) PCT No.: PCT/SG2019/050036
§ 371 (c)(1),
(2) Date: Jul. 21, 2020

(87) PCT Pub. No.: WO2019/143302
PCT Pub. Date: Jul. 25, 2019

(65) Prior Publication Data
US 2021/0058083 A1 Feb. 25, 2021

(30) Foreign Application Priority Data
Jan. 22, 2018 (SG) ............. 10201800549R

(51) Int. Cl.
*H03K 19/003* (2006.01)
*H03K 3/356* (2006.01)

(52) U.S. Cl.
CPC . *H03K 19/00338* (2013.01); *H03K 3/356008* (2013.01); *H03K 3/356104* (2013.01); *H03K 19/00315* (2013.01)

(58) Field of Classification Search
CPC ....... H03K 3/356008; H03K 3/356104; H03K 19/003; H03K 19/00315; H03K 19/0033; H03K 19/00338
(Continued)

(56) References Cited

U.S. PATENT DOCUMENTS

| 4,763,022 A | 8/1988 | Sheldon |
| 5,079,439 A | 1/1992 | Wanlass |

(Continued)

FOREIGN PATENT DOCUMENTS

| CN | 103546146 | 1/2014 |
| CN | 104579275 | 4/2015 |

OTHER PUBLICATIONS

B. Narasimham et al., "A Hysteresis-Based D-Flip-Flop Design in 28 nm CMOS for Improved SER Hardness at Low Performance Overhead," IEEE Transactions on Nuclear Science, vol. 59, No. 6, pp. 2847-2851, Dec. 2012.

(Continued)

*Primary Examiner* — William Hernandez
(74) *Attorney, Agent, or Firm* — Womble Bond Dickinson (US) LLP

(57) ABSTRACT

According to embodiments of the present invention, a circuit is provided. The circuit includes a first set of transistors configured to receive one or more input signals provided to the circuit, and a second set of transistors electrically coupled to each other, wherein the second set of transistors is configured to provide one or more output signals of the circuit, wherein the first set of transistors and the second set of transistors are electrically coupled to each other, and (Continued)

wherein, for each transistor of the first set of transistors and the second set of transistors, the transistor is configured to drive a load associated with the transistor and has an aspect ratio that is sized larger than an aspect ratio of a transistor that is optimized for driving the load.

20 Claims, 12 Drawing Sheets

(58) Field of Classification Search
USPC .................................................. 327/57, 509
See application file for complete search history.

(56) References Cited

U.S. PATENT DOCUMENTS

| | | | |
|---|---|---|---|
| 5,229,666 | A | 7/1993 | Sandhu |
| 5,418,473 | A * | 5/1995 | Canaris .............. H01L 27/0921 257/E27.063 |
| 5,973,512 | A | 10/1999 | Baker |
| 6,380,781 | B1 * | 4/2002 | Karnik ............. G01R 31/31816 326/98 |
| 7,719,304 | B1 | 5/2010 | Clark et al. |
| 9,013,219 | B2 | 4/2015 | Cabanas-Holmen et al. |
| 2001/0054923 | A1 * | 12/2001 | Hazucha .............. H03K 3/0375 327/199 |
| 2007/0132496 | A1 | 6/2007 | Kuboyama et al. |
| 2012/0139578 | A1 | 6/2012 | Lavery et al. |

OTHER PUBLICATIONS

H. H. K. Lee et al., "Design Framework for Soft-Error-Resilient Sequential Cells," IEEE Transactions on Nuclear Science, vol. 58, No. 6, pp. 3026-3032, Dec. 2011.

Intersil, "Radiation Hardened Octal Transparent Latch, Three-State," HCS573MS datasheet, Sep. 1995.

J. Chen et al., "Radiation Hardened by Design Techniques to Reduce Single Event Transient Pulse Width Based on the Physical Mechanism," Microelectronics Reliability, vol. 52, No. 6, pp. 1227-1232, 2012.

J. Jiang et al., "A 5.6 ppm/° C. Temperature Coefficient, 87-dB PSRR, Sub-I-V Voltage Reference in 65-nm CMOS Exploiting the Zero-Temperature-Coefficient Point," in IEEE Journal of Solid-State Circuits, vol. 52, No. 3, pp. 623-633, Mar. 2017.

J. Jiang et al., "Total Ionizing Dose (TID) effects on finger transistors in a 65nm CMOS process," 2016 IEEE International Symposium on Circuits and Systems (ISCAS), Montreal, QC, 2016, pp. 5-8.

J. S. Chang et al., "Radiation-hardened library cell template and its total ionizing dose (TID) delay characterization in 65nm CMOS process," 2014 IEEE 57th International Midwest Symposium on Circuits and Systems (MWSCAS), College Station, TX, 2014, pp. 821-824.

M. Cabanas-Holmen et al., "Robust SEU Mitigation of 32 nm Dual Redundant Flip-Flops Through Interleaving and Sensitive Node-Pair Spacing," IEEE Transactions on Nuclear Science, vol. 60, No. 6, pp. 4374-4380, Dec. 2013.

P. E. Dodd et al., "Current and Future Challenges in Radiation Eifects on CMOS Electronics," IEEE Transactions on Nuclear Science, vol. 57, No. 4, pp. 1747-1763, Aug. 2010.

R. C. Lacoe et al., "Application of hardness-by-design methodology to radiation-tolerant ASIC technologies," IEEE Transactions on Nuclear Science, vol. 47, No. 6, pp. 2334-2341, Dec. 2000.

R. C. Lacoe, "Improving Integrated Circuit Performance Through the Application of Hardness-by-Design Methodology," IEEE Transactions on Nuclear Science, vol. 55, No. 4, pp. 1903-1925, Aug. 2008.

R. M. Diestelhorst et al., "Junction Isolation Single Event Radiation Hardening of a 200 GHZ SiGe:C HBT Technology Without Deep Trench Isolation," IEEE Transactions. Nuclear Science, vol. 56, No. 6, pp. 3402-3407, Dec. 2009.

R. Naseer et al., "DF-DICE: a scalable solution for soft error tolerant circuit design," in Proc. IEEE International Symposium on Circuits and Systems (ISCAS), 2006, pp. 3890-3893.

R. Yamamoto et al., "An Area-Efficient 65mm Radiation-Hard Dual-Modular Flip-flop to avoid multiple cell upsets," IEEE Transactions. Nuclear Science, vol. 58, No. 6, pp. 3053-3059, Dec. 2011.

S. Campitelli, et al., "F-DICE: A multiple node upset tolerant flip-flop for highly radioactive environments," in Proc. IEEE International Symposium on Defect and Fault Tolerance in VLSI and Nanotechnology Systems (DFTS), 2013, pp. 107-111.

T. Calin et al., "Upset Hardened Memory Design for Submicron CMOS Technology," IEEE Transactions on Nuclear Science, vol. 43, No. 6, pp. 2874-2878, Dec. 1996.

T. Lin et al., "Experimental investigation into radiation-hardening-by-design (RHBD) flip-flop designs in a 65nm CMOS process," 2016 IEEE International Symposium on Circuits and Systems (ISCAS), Montreal, QC, 2016, pp. 966-969.

W. Jang. Soft-error Tolerant Quasi Delay-Insensitive Circuits. PhD Thesis, 2008.

Thales E. Becker et al., "Single event transient effects on charge redistribution SAR ADCs," Microelectronics Reliability, Apr. 2017, vol. 73, pp. 22-35.

Quming Zhou et al., "Transistor Sizing for Radiation Hardening," Reliability Physics Symposium Proceedings, 42nd Annual, IEEE 2004, pp. 310-315.

Extended European Search Report issued in corresponding European application No. 19741821.3 dated Sep. 23, 2021.

* cited by examiner

CIRCUIT, METHOD FOR SIZING AN ASPECT RATIO OF TRANSISTORS OF A CIRCUIT, AND CIRCUIT ARRANGEMENT

CROSS-REFERENCE TO RELATED APPLICATIONS

This application is a national stage filing under 35 U.S.C. 371 of PCT/SG2019/050036, filed Jan. 22, 2019, which International Application was published by the International Bureau in English on Jul. 25, 2019, as WO 2019/143302, and which claims the benefit of priority of Singapore patent application No. 10201800549R, filed Jan. 22, 2018, which applications are hereby incorporated by reference in their entirety in this application.

TECHNICAL FIELD

Various embodiments relate to a circuit, a method for sizing an aspect ratio of transistors of a circuit, and a circuit arrangement.

BACKGROUND

In space-and-satellite (S&S) applications, the robustness of integrated circuits (ICs) is one of the most important design considerations. This is because ICs embodied in electronics systems for S&S applications are subjected to various possible radiation effects which potentially jeopardize the functionality of ICs and at worst, cause permanent and irreparable damages to the ICs. Similarly, for high-reliability (high-rel) applications such as automotive (e.g., level 5 autonomous vehicles), the same robustness consideration also applies because alpha-included particles are in the packaging material (emitted from the residual radioactive elements), possibly causing undesirable malfunction and damage on ICs. The possible radiation effects include single-event effects (SEEs) where errors are induced when energized particles strike the ICs. One of the SEEs is single-event-transient (SET) where a single event (e.g., an energised particle) striking at a transistor node induces electrical charges that create a transient pulse on the transistor node. The transient pulse could be detrimental to the ICs. For example, in digital circuits, the transient pulse can result in a single-event-upset (SEU) by flipping the logic state in sequential logic, causing an error. The occurrence of SEEs in ICs is expected to be high when advanced nano-scaled fabrication processes (e.g. <90 nm feature size) are used and/or under severe irradiation environments. Hence, it is highly desirable to mitigate SETs (and hence SEUs) in order to enhance the overall robustness of ICs for S&S and high-rel applications.

To mitigate SEEs, ICs can be realized to be radiation-hardened by means of dedicated IC fabrication processes, design techniques, or a combination thereof. The dedicated IC fabrication processes employed for S&S applications are exotic in the sense that these processes are not readily available and whose costs are typically prohibitive. On the other hand, the design techniques for radiation-hardening, also known as Radiation-Hardened-By-Design (RHBD), are increasingly popular because RHBD techniques can be incorporated into current state-of-the-art commercially-available fabrication processes.

There are known sequential logic, including with some known RHBD practices. FIGS. 1A and 1B depict two known tristate inverters, widely used as building blocks for sequential logic, including latches and flip-flops. FIG. 1A shows a transmission-gate (TG) tristate inverter 170a, while FIG. 1B shows a C$^2$MOS (Clocked-CMOS) tristate inverter 170b. There are four transistors, in the form of two PMOS (p-type metal-oxide-semiconductor) transistors T1, T2, and two NMOS (n-type metal-oxide-semiconductor) transistors T3, T4, connected in the manner as shown in FIGS. 1A and 1B. Also shown is an input signal "A", an output signal "Q" and a signal "EN". For the transmission-gate (TG) tristate inverter 170a, a NOT gate 171a is provided with its input connected to the gate terminal of the NMOS transistor T4 and to receive the signal EN, and its output connected to the gate terminal of the PMOS transistor T2. For the C$^2$MOS tristate inverter 170b, a NOT gate 171b is provided with its input connected to the gate terminal of the NMOS transistor T3 and to receive the signal EN, and its output connected to the gate terminal of the PMOS transistor T2. When EN is '1', Q=$\overline{A}$. When EN is '0', Q is in high impedance. The tristate inverters 170a, 170b can easily be configured for latches and flip-flops. As non-limiting examples, FIGS. 2A and 2B show a TG D flip-flop (transmission-gate delay flip-flop) 270a and a C$^2$MOS D flip-flop (Clocked-CMOS delay flip-flop) 270b respectively having the tristate inverters 170a (FIG. 1A), 170b (FIG. 1B).

Known TG and C$^2$MOS D flip-flops, such as the flip-flops 270a, 270b are vulnerable to SEEs under radiation environments, unless the transistors therein are intentionally up-sized significantly, e.g., by 5×-100× larger than the default sizing (at earth condition). However, the transistor up-sizing practice is generally not adopted because the transistors therein would be very large, costing too much area and power overheads, and, hence, impractical. This will be discussed further below. As a result, other RHBD practices, including the pulse filtering technique, feedback techniques, double redundancy, and Triple Modular Redundancy (TMR), are instead applied to sequential-logic. These other RHBD practices help mitigate SETs/SEUs, and the associated cost (in terms of speed, power dissipation and area overheads) would only be slightly more effective than the standalone transistor up-sizing RHBD practice. Some known RHBD flip-flop designs include DICE (dual inter-locked cell) flip-flop, Temporal DICE flip-flop, dual-path flip-flop, TMR (Triple Modular Redundancy) flip-flop, SET-filter flip-flop, etc. The drawback of these RHBD flip-flop designs is their large transistor count, rendering them uncompetitive.

FIG. 2C shows a schematic diagram of a tristate buffer (without output stacking transistors) 270c of the prior art, which was originally applied for an output pad for a large capacitive load. As may be observed, it is clear that the output Q is charged (to the supply voltage) by one PMOS transistor T1 and is discharged (to ground) by one NMOS transistor T2; there is no stacking transistor to drive the output Q (to either the supply voltage or ground). As the sizing of the transistors T1 and T2 is usually large in order to buffer a large capacitive load, when EN='1', the output Q would inherently be less sensitive to SEEs. When EN='0', the output Q is in high impendence, and will hence be sensitive to SEEs. However, more critically, this tristate buffer 270c is vulnerable because the internal nodes N1 and N2 are easily corrupted by SEEs.

The primary reason why the standalone transistor up-sizing practice is ineffective is because stacking (series) transistor paths make their transistor sizing really large. As a non-limiting example, FIG. 3A illustrates standard sizing for an inverter 370a on earth, assuming a standard (earth-based) inverter with a PMOS transistor 372a and an NMOS transistor 374a having a sizing of ×2 and ×1 respectively. On earth conditions, it is imperative that the transistor sizing is exclusively optimized for high speed, or for low power dissipation, or for small area or a combination of these parameters. For example, the output Q of the inverter 370a drives a load (i.e., total capacitive load, including the internal capacitance contributed by the drains of the NMOS transistor 374a and the PMOS transistor 372a of the inverter 370a, and the external capacitance contributed by the gate or drain of other connecting circuits or by wires, if any). If the load is small, the PMOS transistor 372a of the inverter 370a can quickly charge Q to the supply voltage, or the NMOS transistor 374a of the inverter 370b can quickly discharge Q to ground. In this case, the PMOS and NMOS transistors 372a, 374a may have the minimal sizing so that the inverter 370a could be as small area as possible, and as low power dissipation as possible. Conversely, if the load is large, in order to maintain a speed requirement, the PMOS and NMOS transistors 372a, 374a may be optimally sized-up so that the inverter 370a could just meet the speed requirement with acceptable small area or low power dissipation requirements.

For S&S condition, the sizing of transistors may need to be increased beyond the standard optimized sizing, e.g., 5 times larger, e.g., to ×10 for a PMOS transistor 372b and ×5 for an NMOS transistor 374b as shown in FIG. 3B illustrating RHBD up-sizing for an RHBD inverter 370b. The large transistor sizing helps to mitigate the SEE due to the ionization of the transistors. For example, referring to FIG. 3B, consider first A=1 and Q=0 where the PMOS transistor 372b is off and the NMOS transistor 374b is on. When an energised particle hits the PMOS transistor 372b, the energised particle will ionize the drain diffusion region, causing positive charges to create a positive pulse at the output Q. However, if the NMOS transistor 374b has a large aspect ratio to have a large current drivability, it can quickly absorb the positive charges, hence the positive pulse would unlikely be created. Similarly, consider now A=0 and Q=1 where the PMOS transistor 372b is on and the NMOS transistor 374b is off. When an energised particle hits the NMOS transistor 374b, the energised particle will ionize the drain diffusion region, causing negative charges to create a negative pulse at the output Q. However, if the PMOS transistor 372b has a large aspect ratio to have a large current drivability, it can quickly absorb the negative charges, hence the negative pulse would unlikely be created.

When two stacking transistors are needed for both PMOS and NMOS, in order to achieve the same effective sizing (meaning sized to achieve the same current strength) as the RHBD inverter 370b, referring to FIG. 3C illustrating RHBD up-sizing for an RHBD inverting C-Muller 370c, the PMOS transistors 372c, 373c need to have a sizing of ×20, with the NMOS transistors 374c, 375c having a sizing of ×10. In FIG. 3C, the PMOS transistors 372c, 373c together form stacking transistors (to charge Q to the supply voltage) and the NMOS transistors 374c, 375c together form stacking transistors (to discharge Q to ground). The transistor up-sizing would be even larger for higher stacking transistors (e.g., 3), hence, too expensive in terms of area and power dissipation. For the inverters 370a, 370b, 370c, the sizing value or factor described refers to the corresponding aspect ratio of the transistor.

Referring again to FIGS. 1A and 1B for the tristate inverters 170a, 170b whose PMOS transistors T1 and T2 are in series, and NMOS transistors T3 and T4 are in series, in order to achieve the same effective sizing as the RHBD inverter 370b (FIG. 3B), the PMOS transistors T1 and T2 need to be sized larger, or, otherwise the output nodes 176a, 176b are vulnerable to SEEs. By scrutinizing the schematics of the TG flip-flop 270a (FIG. 2A) and the CMOS flop-flop 270b (FIG. 2B), it can be ascertained that the internal nodes N1 and N2 are the weakest nodes (i.e., which are vulnerable to SEEs). Put simply, it is always a trade-off how to size various transistors to strike a balance among the various figures-of-merit such as reliability (radiation hardness), power dissipation, IC area and speed. Due to the fundamental sizing limitation, stacking transistors remain the bottleneck for effective transistor up-sizing.

In view of the limitations of the transistor up-sizing technique for known latch and flip-flop designs, there is need for a transistor up-sizing technique for effective mitigation of SEEs.

SUMMARY

The invention is defined in the independent claims. Further embodiments of the invention are defined in the dependent claims.

According to an embodiment, a circuit is provided. The circuit may include a first set of transistors configured to receive one or more input signals provided to the circuit, and a second set of transistors electrically coupled to each other, wherein the second set of transistors is configured to provide one or more output signals of the circuit, wherein the first set of transistors and the second set of transistors are electrically coupled to each other, and wherein, for each transistor of the first set of transistors and the second set of transistors, the transistor is configured to drive a load associated with the transistor and has an aspect ratio that is sized larger than an aspect ratio of a transistor that is optimized for driving the load.

According to an embodiment, a method for sizing an aspect ratio of transistors of a circuit to increase a linear energy transfer threshold of a circuit due to ionization at different nodes of the circuit, the method including arranging a first set of transistors of the circuit to receive one or more input signals provided to the circuit, the first set of transistors having a first transistor whose aspect ratio is enlarged to charge its output node to absorb the ionization at the output node, and a second transistor whose aspect ratio is enlarged to discharge its output node to absorb the ionization at the output node, arranging a second set of transistors of the circuit to output one or more output signals of the circuit, the second set of transistors having a third transistor whose aspect ratio is enlarged to charge its output node to absorb the ionization at the output node, and a fourth transistor whose aspect ratio is enlarged to discharge its output node to absorb the ionization at the output node, and arranging a third set of transistors configured as a control sub-circuit electrically coupled to the first set of transistors and the second set of transistors, wherein the control sub-circuit is configured to receive one or more control signals.

According to an embodiment, a circuit arrangement is provided. The circuit arrangement may include a plurality of sub-circuits electrically coupled to each other, wherein each sub-circuit of the plurality of sub-circuits is the circuit as described herein or the circuit as obtained by the method as described herein.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 2A shows a schematic diagram of a transmission-gate flip-flop of the prior art, while

DETAILED DESCRIPTION

Figure 1A:
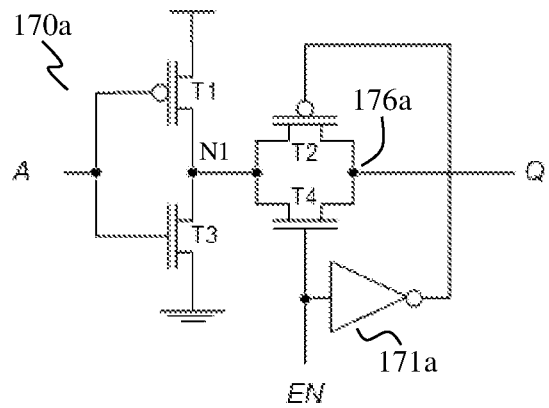
FIGS. 1A and 1B show schematic diagrams of tristate inverters of the prior art, respectively based on transmission-gate, and C²MOS (Clocked-CMOS).
Figure 1B:
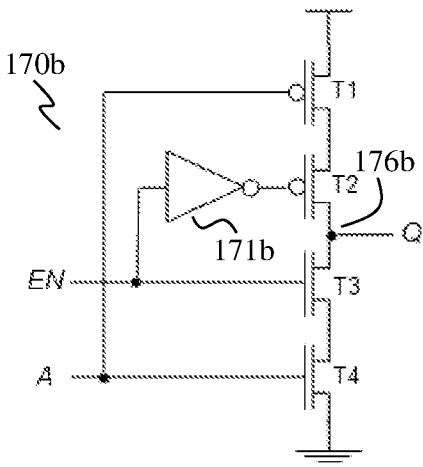
Figure 2C:
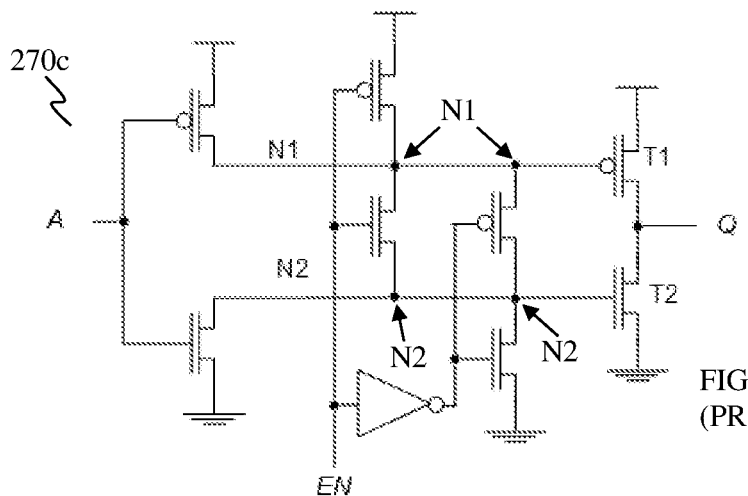
FIG. 2C shows a schematic diagram of a tristate buffer of the prior art.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide one or more low soft-error-rate digital circuits.

Various embodiments may provide a transistor connection technique for digital circuits (for example, sequential logic) where an up-sizing technique may be effective to mitigate single-event effects (SEEs).

Various embodiments may relate to Radiation-Hardened-By-Design (RHBD) techniques to mitigate single-event effects (SEEs) in digital circuits, for example, for sequential logic, for space-and-satellite (S&S) applications, and for high-reliability (high-rel) applications.

Various embodiments may pertain to a transistor configuration and its associated up-sizing technique for realizing digital circuits to mitigate SETs/SEUs.

Various embodiments may relate to a technique or method of designing a digital circuit having primary input(s), internal nodes and primary output(s). For a given input condition, the digital circuit may be designed such that the internal nodes and the primary outputs may be discharged/discharged for their logical state. For a given input condition, the critical internal nodes (which are used to maintain the logical function of the digital circuit) and the primary output(s) may be driven by up-sized transistors (including non-stacking up-sized transistors) to mitigate SEEs. In the context of various embodiments, a non-stacking transistor refers to a transistor that is not connected in series to another transistor of the same conductivity type in order to drive an output. For example, for a PMOS transistor and an NMOS transistor connected in series to each other, each of the PMOS transistor and the NMOS transistor is a non-stacking transistor.

Non-limiting example embodiments may provide a transistor connection technique in a digital circuit having a first set of transistors driving at least one internal node and a second set of transistors driving at least one primary output, wherein the at least one internal node may be driven by at least one transistor of the first set of transistors, and the at least one primary output may be driven by at least one non-stacking transistor of the second set of transistors.

The at least one transistor of the first set of transistors may be up-sized, and the at least one non-stacking transistor of the second set of transistors may be up-sized. When a transistor of the at least one transistor of the first set of transistors is ON to drive the at least one internal node, and to suppress a voltage pulse caused by energized particles, when the at least one non-stacking transistor of the second set of transistors is ON to drive the at least one primary output, and to suppress a voltage pulse caused by energized particles, when another transistor of the at least one transistor of the first set of transistors is OFF, a voltage pulse caused by energized particles on the at least one internal node will not or may not affect the logic state of the at least one primary output.

Various embodiments may relate to a transistor connection with a transistor up-sizing technique to realize a small-area low-power digital circuit that is hardened to reduce soft errors, including those errors due to single-event-transients (SETs) and single-event-upsets (SEUs). The technique may be applied in digital circuit schematic implementation, where each node (both internal and external) may be configured to be driven by transistors (including non-stacking transistors) which may be area-efficient for realizing large W/L (width/length) transistors. These large W/L transistors may be up-sized to suppress any SET caused by electron-hole pairs due to energized particles (e.g., alpha particles, neutrons, protons and heavy ions). On the basis of flip-flop designs, the flip-flop design according to the technique disclosed herein may have 5.2× to 11.5× better error-rate× power×area composite figure-of-merit than the flip-flops according to the known or standard RHBD up-sizing technique.

Various embodiments may provide one or more of the following as compared to known methods: (i) the mitigation of SEEs (arising from strikes for particles) in digital circuits, hence reducing the associated error rate, (ii) achieve a small transistor-count for digital circuits, hence the associated layout complexity and silicon area are reduced (over most of the RHBD sequential logic designs), (iii) achieve lower power dissipation for digital circuits (when compared to known RHBD sequential logic designs). In view of the above, the techniques disclosed herein may provide for robust operation to mitigate SETs/SEUs.

Figure 4A:
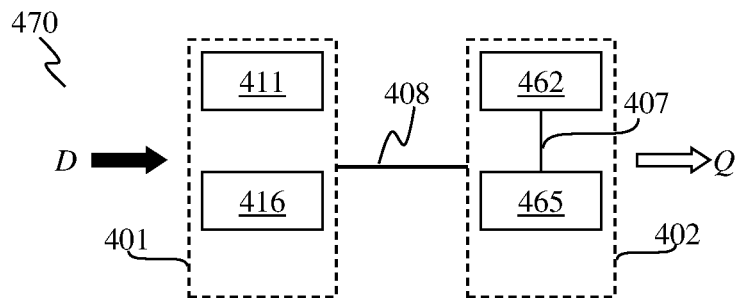
FIG. 4A shows a schematic view of a circuit, according to various embodiments.

FIG. 4A shows a schematic view of a circuit 470, according to various embodiments. The circuit 470 includes a first set of transistors (two transistors 411, 416 are illustratively shown) configured to receive one or more input signals (one input signal D is illustratively shown) provided to the circuit 470, and a second set of transistors (two transistors 462, 465 are illustratively shown) electrically coupled (as represented by the line 407) to each other, wherein the second set of transistors 462, 465 is configured to provide one or more output signals (one output signal Q is illustratively shown) of the circuit 470, wherein the first set of transistors 411, 416 and the second set of transistors 462, 465 are electrically coupled (as represented by the line 408) to each other, and wherein, for each transistor of the first set of transistors 411, 416 and the second set of transistors 462, 465, the transistor is configured to drive a load associated with the transistor and has an aspect ratio that is sized larger than an aspect ratio of a transistor that is optimized for driving the load. The first set of transistors 411, 416 is illustratively collectively shown within the dashed box 401, while the second set of transistors 462, 465 is illustratively collectively shown within the dashed box 402. As will be explained further below, the specific aspect value may be determined to meet a linear energy transfer (LET) threshold of the circuit 470 under radiation environment.

In other words, a circuit 470 having a plurality of transistors may be provided. The circuit 470 may include transistors 411, 416. The transistors 411, 416 may be electrically coupled or connected to each other. The transistors 411, 416 may form part of a first transistor set that may receive at least one input signal D that may be supplied to the circuit 470. The circuit 470 may further include transistors 462, 465 that may be electrically coupled or connected to each other, and form part of a second transistor set that may provide at least one output signal Q of the circuit 470. This may mean that the second set of transistors 462, 465 may provide a signal that is an output signal Q of the circuit 470. The transistors 411, 416, 462, 465 may be electrically coupled or connected to each other.

Each transistor 411, 416, 462, 465 may drive a load associated with the transistor and may have an aspect ratio that is sized larger (enlarged) than an aspect ratio of a transistor that is optimized ("optimized transistor") for driving the load. In various embodiments, a transistor may be optimized in terms of at least one of speed, area, or power dissipation, meaning that the sizing of an optimized transistor may be kept to be as small as possible subject to meeting at least one of the speed, power or area constraints. This may mean that each transistor 411, 416, 462, 465 is an up-sized transistor as compared to a transistor with a standard aspect ratio (see later for illustration). "Up-sizing" here means that a transistor has an even larger aspect ratio than that of a standard transistor. The value of the aspect ratio to be designed may depend on the linear energy transfer (LET) threshold of the corresponding circuit. As a non-limiting example, each transistor 411, 416, 462, 465 may have an aspect ratio of a defined value such that the LET threshold of the circuit 470 is at least 1 McV·cm$^2$/mg, and for some high radiation conditions, >10 McV·cm$^2$/mg. Each such up-sized transistor 411, 416, 462, 465 may be helpful for mitigating single-event effects (SEEs), e.g., single-event-upsets (SEUs) and/or single-event-transients (SETs), that may be caused by energised particles or radiation particles (e.g., alpha particles, neutrons, protons and heavy ions) striking the transistor, and/or for providing an increased current level for the transistor. Otherwise, such single-event effects (SEEs) may cause an error in the output state of the circuit 470, or change the output Q of the circuit to a state that is not in accordance with the one or more input signals D received by the circuit 470.

The first set of transistors 411, 416 may be electrically coupled or connected to an input node of the circuit 470. This may mean that the first set of transistors 411, 416 may be input transistors. The gate (G) terminals of the first set of transistors 411, 416 may be connected to the input node of the circuit 470. The one or more input signals D may be received by the gate (G) terminals of the first set of transistors 411, 416. The gate (G) terminals of the first set of transistors 411, 416 may be connected to each other.

The first set of transistors 411, 416 may include or may be a first pair of transistors, for example, a first transistor (e.g., 411) and a second transistor (e.g., 416). The first set of transistors 411, 416 may include at least one transistor (e.g., 411) of a first conductivity type and at least one transistor (e.g., 416) of a second conductivity type.

The first set of transistors 411, 416 may be configured to drive one or more internal interconnection nodes of the circuit 470 in response to the one or more input signals D received. Each up-sized transistor 411, 416 may help to suppress a voltage pulse that may result from energised particles striking at least one transistor of the first set of transistors 411, 416 so that the state of the resulting output signal Q of the circuit 470 is the desired state in accordance with the one or more input signals D received by the circuit 470. In the context of various embodiments, an internal interconnection node is a node along an electrical path between the first set of transistors 411, 416 and the second set of transistors 462, 465, for example, an electrical path from a drain (D) terminal of a respective transistor of the first set of transistors 411, 416 to a gate (G) terminal of a respective transistor of the second set of transistors 462, 465 that is connected to the drain (D) terminal.

The second set of transistors 462, 465 may be electrically coupled or connected to an output node of the circuit 470. This may mean that the second set of transistors 462, 465 may be output transistors. The drain (D) terminals of the second set of transistors 462, 465 may be connected to the output node of the circuit 470. The drain (D) terminals of the second set of transistors 462, 465 may be connected to each other.

The second set of transistors 462, 465 may include or may be a second pair of transistors, for example, a third transistor (e.g., 462) and a fourth transistor (e.g., 465). The second set of transistors 462, 465 may include at least one transistor (e.g., 462) of a first conductivity type and at least one transistor (e.g., 465) of a second conductivity type.

The second set of transistors 462, 465 may be configured to drive an output node of the circuit 470 to provide the output signal Q. This may mean that the output node of the circuit 470 may be driven by an up-sized transistor 462, 465 in response to or in accordance with the one or more input signals D received. Each up-sized transistor 462, 465 may help to suppress a voltage pulse that may result from energised particles striking at least one transistor of the second set of transistors 462, 465 so that the state of the resulting output signal Q of the circuit 470 is the desired state in accordance with the one or more input signals D received by the circuit 470.

Figure 4B:
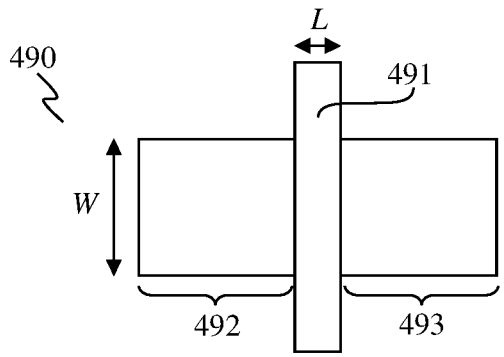
FIG. 4B shows a schematic view of a transistor, according to various embodiments.

In the context of various embodiments, the term "aspect ratio" as applied to a transistor means the ratio of the width, W, of the transistor to the length, L, of the transistor, i.e., aspect ratio=W/L. The aspect ratio of a transistor, the width, W, of a transistor, and the length, L, of a transistor are terms familiar to the skilled person. Referring to FIG. 4B for a transistor 490 having a gate (G) 491, a drain (D) 492 and a source (S) 493, the length, L, refers to the length of the gate (G) 491, while the width, W, refers to the width of the drain (D) 492 and/or the source (S) 493. The length, L, is generally fixed by the fabrication technology used, for example, 65 nm fabrication process. The width, W, may be controlled, for example, to match the length, L, so that the resulting aspect ratio (i.e., W/L) is one, or to be larger than the length, L, so that the resulting aspect ratio is more than one. Generally (but not fixed for various fabrication processes), the minimum width of W (termed as $W_{min}$) is about 2 times of L. Further, the current level of a transistor is generally related to or determined by the width, W, where the current, $I_D$ α W/L. As such, by providing a larger width, W, where W>>$W_{min}$ such that the corresponding aspect ratio is >>1, the current level for the transistor is increased such that there may be a stronger driving current. On earth conditions, for circuits (e.g., digital circuits), for a standard transistor, the width W is preferably sized to be $W_{min}$, or a slightly larger value as long as the overall circuit just meets the speed, area or power dissipation specifications. For S&S condition, the width W may be increased beyond the standard transistor sizing to increase the LET threshold of the overall circuit such that the effect of SEEs may be mitigated or countered.

In the context of various embodiments, for an up-sized transistor, the corresponding aspect ratio may be more than 2, e.g., ≥2.5, ≥3, ≥5, ≥8, ≥10, ≥20, ≥50 or ≥100, or between about 2.1 and about 100, between about 2.1 and about 50, between about 2.1 and about 20, between about 2.1 and about 10, between about 2.5 and about 100, between about 2.5 and about 50, between about 2.5 and about 20, between about 2.5 and about 10, or between about 5 and about 20.

In the context of various embodiments, the term "aspect ratio" for a transistor having an aspect ratio >$W_{min}$/L (e.g., >2) may also refer to an up-sizing factor or value of the transistor. For example, an aspect ratio of 6 may mean that the corresponding transistor has an up-sizing factor of 3 (i.e., 3×) compared to a transistor with a default aspect ratio (e.g., $W_{min}$=2L).

In the context of various embodiments, the load that may be driven by a transistor may include the total capacitive load, including the internal capacitance contributed by the drain of the transistor, and, if any, the external capacitance contributed by the gate or drain of a connecting transistor or circuit, or by wires.

In various embodiments, the aspect ratio for each transistor 411, 416, 462, 465 may be at least 2.5, at least 6, or at least 10.

In various embodiments, for each transistor of the first set of transistors 411, 416 and the second set of transistors 462, 468, the aspect ratio may be designed to increase a linear energy transfer (LET) threshold of the circuit 470. As non-limiting example, each transistor may be designed to have an aspect ratio of a defined value such that a linear energy transfer (LET) threshold of the circuit 470 may be at least 1 MeV·cm²/mg. This may be helpful for the circuit 470 to withstand an effect of energised particles having the associated LET in the range described. With up-sized transistors having a large aspect ratio, the LET threshold of the circuit 470 may be increased. For example, a transistor with an aspect ratio of 2.5 may have an LET threshold of 1 McV·cm²/mg for some very mild radiation environments, while an upsized transistor with an aspect ratio of 10 may have an LET threshold of 10 McV·cm²/mg. As non-limiting examples, the LET threshold may be between about 1 McV·cm²/mg and about 50 McV·cm²/mg, between about 1 McV·cm²/mg and about 30 McV·cm²/mg, between about 1 McV·cm²/mg and about 20 McV·cm²/mg, between about 30 McV·cm²/mg and about 100 McV·cm²/mg, between about 50 McV·cm²/mg and about 100 McV·cm²/mg, between about 20 McV·cm²/mg and about 50 McV·cm²/mg, or between about 30 McV·cm²/mg and about 70 McV·cm²/mg. The term "linear energy transfer" or its acronym "LET" means the average amount of energy that a charged particle or energised particle transfers to a material per unit pathlength travelled by the particle through the material. The LET threshold means that the minimal amount of LET that a charged particle can cause an erroneous SET or SEU to a circuit.

In various embodiments, the first set of transistors 411, 416 may include a first transistor (e.g., 411) of a first conductivity type, and a second transistor (e.g., 416) of a second conductivity type.

In various embodiments, each transistor of the second set of transistors 462, 465 may be a non-stacking transistor. A non-stacking transistor means a transistor that is not connected in series with another transistor of the same conductivity type to drive an output. For comparison purposes, referring to FIG. 1A as an example, the output Q is driven by stacking transistors, i.e., by PMOS stacking transistors T1 and T2 to charge Q to the supply voltage, or by NMOS stacking transistors T3 and T4 to discharge Q to ground. A stacking transistor means a transistor that is connected in series with another transistor of the same conductivity type to drive an output.

In various embodiments, the second set of transistors 462, 465 may include a third transistor (e.g., 462) of a first conductivity type, and a fourth transistor (e.g., 465) of a second conductivity type. The third transistor and the fourth transistor may be connected drain-to-drain.

In various embodiments of the circuit 470, each of the first set of transistors 411, 416 and the second set of transistors 462, 465 may have a respective transistor of the first conductivity type and a respective transistor of the second conductivity type.

In the context of various embodiments, the first conductivity type and the second conductivity type may be opposite conductivity types or opposite polarities. The first conductivity type may be a p-type conductivity and a transistor of the first conductivity type may be a PMOS transistor (e.g., p-channel MOSFET), while the second conductivity type may be an n-type conductivity and a transistor of the second conductivity type may be an NMOS transistor (e.g., n-channel MOSFET). Alternatively, the first conductivity type may be an n-type conductivity and the second conductivity type may be a p-type conductivity.

In various embodiments, the first set of transistors 411, 416 may include at least one pair of stacking transistors. The stacking transistors may be of a first conductivity type or a second conductivity type.

In various embodiments, the first set of transistors may include a first pair of stacking transistors of a first conductivity type, and a second pair of stacking transistors of a second conductivity type. The transistors of the first pair of stacking transistors may be connected in series to each other. The transistors of the second pair of stacking transistors may be connected in series to each other. The first set of transistors may include one or more additional stacking transistors of the first conductivity type stacked with the first pair of stacking transistors, and/or one or more additional stacking transistors of the second conductivity type stacked with the second pair of stacking transistors.

In various embodiments, a drain (D) terminal of a transistor (e.g., 411) of the first set of transistors may be connected to a gate (G) terminal of a transistor (e.g., 462) of the second set of transistors, the transistors being of first conductivity type, and a drain (D) terminal of another transistor (e.g., 416) of the first set of transistors may be connected to a gate (G) terminal of another transistor (e.g., 465) of the second set of transistors, the other transistors being of second conductivity type and opposite to the first conductivity type.

The circuit 470 may further include a control sub-circuit electrically coupled to the first set of transistors 411, 416 and the second set of transistors 462, 465, the control sub-circuit being configured to receive one or more control signals provided to the circuit 470, wherein the control sub-circuit may include one or more transistors configured to, in response to the one or more control signals received, control an electrical signal flow within the first set of transistors 411, 416, and from the first set of transistors 411, 416 to the second set of transistors 462, 465. The one or more control signals may be provided to the plurality of transistors of the control sub-circuit, e.g., to the corresponding gate (G) terminals of the plurality of transistors. The control sub-circuit may include pairs of transistors, for example, each pair may be of opposite conductivity types. The control sub-circuit may be arranged in an electrical path from the first set of transistors 411, 416 to the second set of transistors 462, 465. For example, the control sub-circuit may be arranged in between the first set of transistors 411, 416 and the second set of transistors 462, 465. The plurality of transistors of the control sub-circuit may be connected to the one or more internal interconnection nodes.

The circuit 470 may further include a control signal sub-circuit electrically coupled to the control sub-circuit, wherein the control signal sub-circuit may include a plurality of transistors for providing the one or more control signals to the control sub-circuit. Each transistor of the plurality of transistors of the control signal sub-circuit may have an enlarged aspect ratio such that the LET threshold of the circuit 470 is increased.

In various embodiments, the circuit 470 may be a digital logic circuit.

In various embodiments, the circuit 470 may be a tristate buffer.

Various embodiments may also provide a circuit having an increased linear energy transfer threshold including a first set of transistors configured to receive one or more input signals provided to the circuit, and having one or more transistors whose aspect ratio is enlarged, a second set of transistors configured to output one or more output signals of the circuit, and having one or more transistors whose aspect ratio is enlarged, and a third set of transistors configured as a control sub-circuit electrically coupled to the first set of transistors and the second set of transistors, wherein the control sub-circuit is configured to receive one or more control signals, and wherein the third set of transistors includes one or more transistors whose aspect ratio may or may not be enlarged, wherein, for each transistor having the enlarged aspect ratio, the transistor is configured to drive a load associated with the transistor and the enlarged aspect ratio is more than an aspect ratio of a transistor that is optimized for driving the load.

In the context of various embodiments, generally, two transistors of different or opposite conductivity types (e.g., a PMOS transistor and an NMOS transistor) may be provided for mitigating SEEs in a circuit. This may mean that an internal interconnection node of a circuit may be protected by a PMOS transistor and an NMOS transistor. When energised particles or radiation particles strike one of the transistors resulting in increased charges of a particular conductivity type and therefore, a voltage pulse of a corresponding sign (e.g., positive or negative pulse), the other transistor of the other conductivity type may supply opposite charges to counter such effect, by at least minimising the amplitude of the voltage pulse, thereby ensuring proper operation of the circuit.

In the context of various embodiments, a transistor having an enlarged aspect ratio (i.e., up-sized transistor) may help to increase the LET threshold of the circuit having the transistor.

Figure 4C:
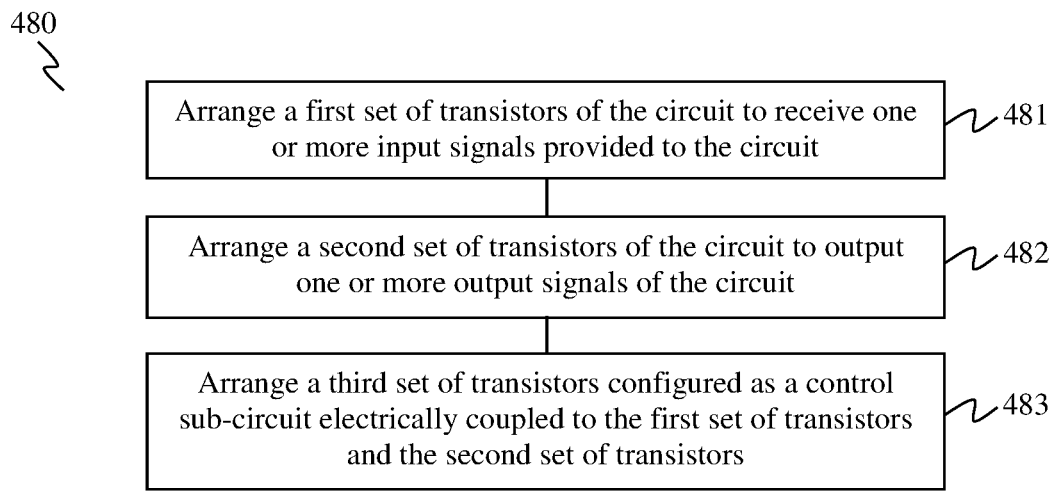
FIG. 4C shows a flow chart illustrating a method for sizing an aspect ratio of transistors of a circuit, according to various embodiments.

FIG. 4C shows a flow chart 480 illustrating a method for sizing an aspect ratio of transistors of a circuit to increase a linear energy transfer threshold of a circuit due to ionization at different nodes of the circuit, according to various embodiments.

At 481, a first set of transistors of the circuit is arranged to receive one or more input signals provided to the circuit. The first set of transistors includes a first transistor whose aspect ratio is enlarged to charge its output node to absorb the ionization at the output node, and a second transistor whose aspect ratio is enlarged to discharge its output node to absorb the ionization at the output node.

At 482, a second set of transistors of the circuit is arranged to output one or more output signals of the circuit. The second set of transistors includes a third transistor whose aspect ratio is enlarged to charge its output node to absorb the ionization at the output node, and a fourth transistor whose aspect ratio is enlarged to discharge its output node to absorb the ionization at the output node.

At 483, a third set of transistors configured as a control sub-circuit is arranged electrically coupled to the first set of transistors and the second set of transistors. The control sub-circuit is configured to receive one or more control signals.

For each of the first, second, third and fourth transistors, the aspect ratio of the transistor may be enlarged by increasing the aspect ratio to at least 2.5.

It should be appreciated that descriptions in the context of the circuit 470 may correspondingly be applicable in relation to the method described in the context of the flow chart 480.

Various embodiments may also provide a method for increasing a linear energy transfer threshold of a circuit, including arranging a first set of transistors of the circuit to receive one or more input signals provided to the circuit, electrically coupling a second set of transistors of the circuit to each other, the second set of transistors being configured to provide one or more output signals of the circuit, and electrically coupling the first set of transistors and the second set of transistors to each other, wherein for each transistor of the first set of transistors and the second set of transistors, the transistor is configured to drive a load associated with the transistor and has an aspect ratio that is sized larger than a transistor that is optimized for driving the load.

Figure 4D:
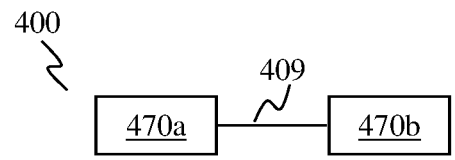
FIG. 4D shows a schematic view of a circuit arrangement, according to various embodiments.

FIG. 4D shows a schematic view of a circuit arrangement 400 according to various embodiments. The circuit arrangement 400 includes a plurality of sub-circuits (two sub-circuits 470a, 470b are illustratively shown) electrically coupled (as represented by the line 409) to each other, wherein each sub-circuit of the plurality of sub-circuits 470a, 470b may be as described in the context of the circuit 470 (FIG. 4A) or a circuit as obtained by the method described in the context of the flow chart 480. It should be appreciated that the circuit arrangement 400 may include more than two sub-circuits electrically coupled to each other, for example, three, four, five or any higher number of sub-circuits.

In various embodiments, the plurality of sub-circuits 470, 470b may include at least two sub-circuits 470, 470b connected in series to each other. This may mean that an output node of a preceding sub-circuit (e.g., 470a) may be connected to an input node of a succeeding sub-circuit (e.g., 470b). The at least two sub-circuits 470, 470b may be connected to each other at an interconnecting node. The output node of the preceding sub-circuit and the input node of the succeeding sub-circuit may define the interconnecting node.

In various embodiments, the at least two sub-circuits may include a first sub-circuit (e.g., 470a) and a second sub-circuit (e.g., 470b) connected in series to each other. The circuit arrangement 400 may further include a feedback sub-circuit, wherein an output of the feedback sub-circuit may be connected to an interconnecting node between the first and second sub-circuits, and wherein one or more inputs of the feedback sub-circuit may be connected to one or more internal interconnection nodes of the second sub-circuit or configured to receive one or more control signals provided to the circuit arrangement 400.

In various embodiments, each transistor of the feedback sub-circuit may have an enlarged aspect ratio such that the LET threshold of the circuit arrangement 400 is increased.

In various embodiments, each transistor of the feedback sub-circuit may be a non-stacking transistor.

The feedback sub-circuit may include a pair of stacking transistors of one conductivity type (e.g., first conductivity type) and a pair of non-stacking transistors of the opposite conductivity type (e.g., second conductivity type). For each transistor of the pair of stacking transistors and the pair of non-stacking transistors, the transistor may be configured to drive a load associated with the transistor and may have an aspect ratio that may be sized larger than a transistor that is optimized for driving the load. The aspect ratio may be at least 2.5.

In various embodiments, the plurality of sub-circuits may further include a third sub-circuit, wherein an input and an output of the third sub-circuit may be connected to an output of the second sub-circuit.

In the context of various embodiments, the circuit arrangement 400 may be a flip-flop.

In various embodiments, the plurality of sub-circuits may include a first sub-circuit (e.g., 470a), and a second sub-circuit (e.g., 470b), wherein an input and an output of the second sub-circuit may be connected to an output of the first sub-circuit. The circuit arrangement 400 may be a latch.

In various embodiments, the plurality of sub-circuits may include a first sub-circuit, a second sub-circuit, a third sub-circuit and a fourth sub-circuit, wherein an input and an output of the second sub-circuit may be connected to an output of the first sub-circuit and to an input of the third sub-circuit, and wherein an input and an output of the fourth sub-circuit may be connected to an output of the third sub-circuit. The circuit arrangement 400 may be a flip-flop.

In the context of various embodiments, the circuit arrangement 400 may be a digital logic circuit arrangement.

In the context of various embodiments, the circuit arrangement 400 may be a sequential logic circuit arrangement, including, for example, a latch, a flip-flop or a state-holding circuit.

Figure 5:
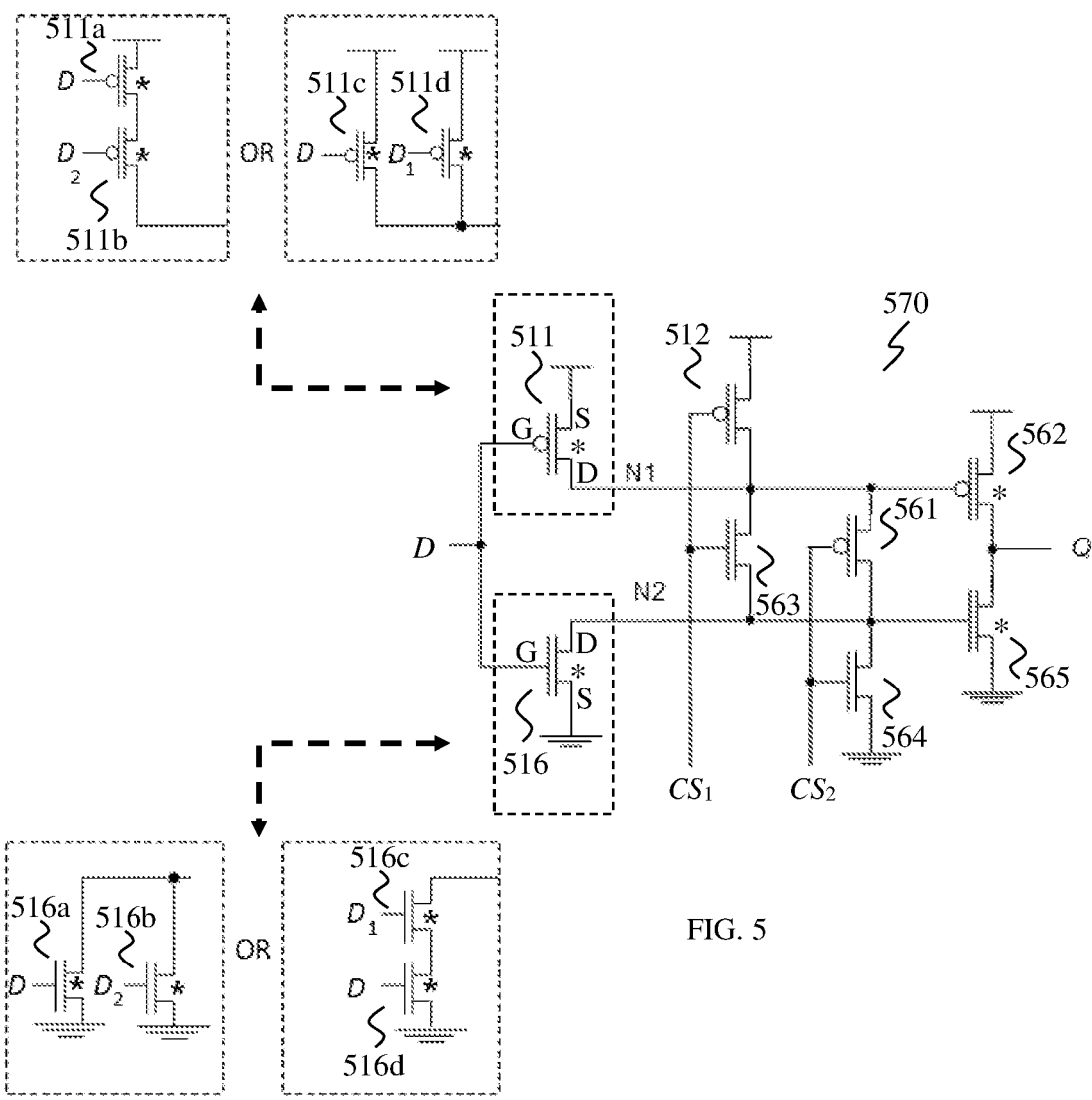
FIG. 5 shows a schematic view of a circuit, according to various embodiments.

FIG. 5 shows a schematic view of a circuit 570, according to various embodiments. The circuit 570 has a plurality of transistors, including a plurality of PMOS transistors 511, 512, 561, 562 and a plurality of NMOS transistors 516, 563, 564, 565, where the transistors 511, 512, 561, 562, 516, 563, 564, 565 are electrically coupled to each other. As may be appreciated, each PMOS transistor 511, 512, 561, 562 may include a gate (G) terminal, a drain (D) terminal and a source (S) terminal (see, for example, the PMOS transistor 511). Similarly, each NMOS transistor 516, 563, 564, 565 may include a gate (G) terminal, a drain (D) terminal and a source (S) terminal (see, for example, the NMOS transistor 516).

The PMOS transistor 511 and the NMOS transistor 516 may be electrically coupled to each other and may define a first set of transistors that may receive an input signal D. The input signal D may be provided to the gate (G) terminals of the transistors 511, 516. The PMOS transistor 562 and the NMOS transistor 565 may be electrically coupled to each other and may define a second set of transistors that may provide an output signal Q of the circuit 570. The output signal Q may be provided from the drain (D) terminals of the transistors 562, 565.

In greater detail, the gate (G) terminals of the transistors 511, 516 may be connected to an input or input node to receive an input signal, D. The transistors 511, 516 may define input transistors. The gate (G) terminals of the transistors 512, 563 may be connected to each other to receive a control signal (or clock signal), $CS_1$. The gate (G) terminals of the transistors 561, 564 may be connected to each other to receive another control signal (or clock signal), $CS_2$. The source (S) terminals of the transistors 511, 512, 562 may be connected to a power supply (e.g., $V_{DD}$), for example, to the same power supply or to respective power supplies. The source (S) terminals of the transistors 516, 564, 565 may be connected to ground. The drain (D)

terminals of the transistors 511, 512, 563, the source (S) terminal of the transistor 561, and the gate (G) terminal of the transistor 562 may be connected to an internal interconnecting node N1 and to each other. The drain (D) terminals of the transistors 516, 561, 564, the source (S) terminal of the transistor 563, and the gate (G) terminal of the transistor 565 may be connected to another internal interconnecting node N2 and to each other. The drain (D) terminals of the transistors 562, 565 may be connected to an output or output node. The transistors 562, 565 may define output transistors. The internal transistors 512, 561, 563, 564 may define a control sub-circuit between the set of input transistors 511, 516 and the set of output transistors 562, 565.

The transistors 511, 516, 562, 565 are marked with an asterisk (*) to represent up-sized transistors, meaning that each transistor 511, 516, 562, 565 has a large aspect ratio (i.e., width to length (W/L)) for the purpose of mitigating SEEs that may be caused by energised particles striking the circuit 570 or these transistors 511, 516, 562, 565. The remaining transistors 512, 561, 563, 564 may be sized minimally, for example, having an aspect ratio of $W_{min}/L$. As may be appreciated, the nodes N1, N2 may be driven by the up-sized transistors 511, 516 in response to the input signal, D. Further, the output node from which the output signal Q may be provided may be driven by the up-sized transistors 562, 565. The control signals, $CS_1$ and $CS_2$, may be supplied or provided from a control signal sub-circuit or clock sub-circuit (not shown) which may be a NOT gate or an inverter circuit having a PMOS transistor and an NMOS transistor connected to each other, where each transistor may be an up-sized transistor.

The circuit 570 may be a tristate buffer with up-sized transistors 511, 516, 562, 565.

In further embodiments, the PMOS transistor 511 may be replaced by two or more PMOS transistors that, relative to each other, may be stacking transistors or non-stacking transistors, and/or the NMOS transistor 516 may be replaced by two or more NMOS transistors that, relative to each other, may be stacking transistors or non-stacking transistors.

Referring to FIG. 5, the PMOS transistor 511 may be replaced by a pair of stacking PMOS transistors 511a, 511b connected in series to each other, or PMOS transistors 511c, 511d that are connected in a non-stacking configuration relative to each other. The PMOS transistors 511a, 511b may be provided with the same input signal to their gate (G) terminals or different input signals, D and $D_2$, as shown in FIG. 5. For the PMOS transistors 511c, 511d, their drain (D) terminals may be connected to each other, with their gate (G) terminals receiving different inputs, D and $D_1$. Similarly, the NMOS transistor 516 may be replaced by NMOS transistors 516a, 516b that are connected in a non-stacking configuration relative to each other, or a pair of stacking NMOS transistors 516c, 516d connected in series to each other. For the NMOS transistors 516a, 516b, their drain (D) terminals may be connected to each other, with their gate (G) terminals receiving different inputs, D and $D_2$. The NMOS transistors 516c, 516d may be provided with the same input signal to their gate (G) terminals or different input signals, D and $D_1$, as shown in FIG. 5.

Various embodiments of circuit arrangements having a plurality of sub-circuits, where one or more of the sub-circuits may be similar to the circuit 570 will now be described below.

Figure 6A:
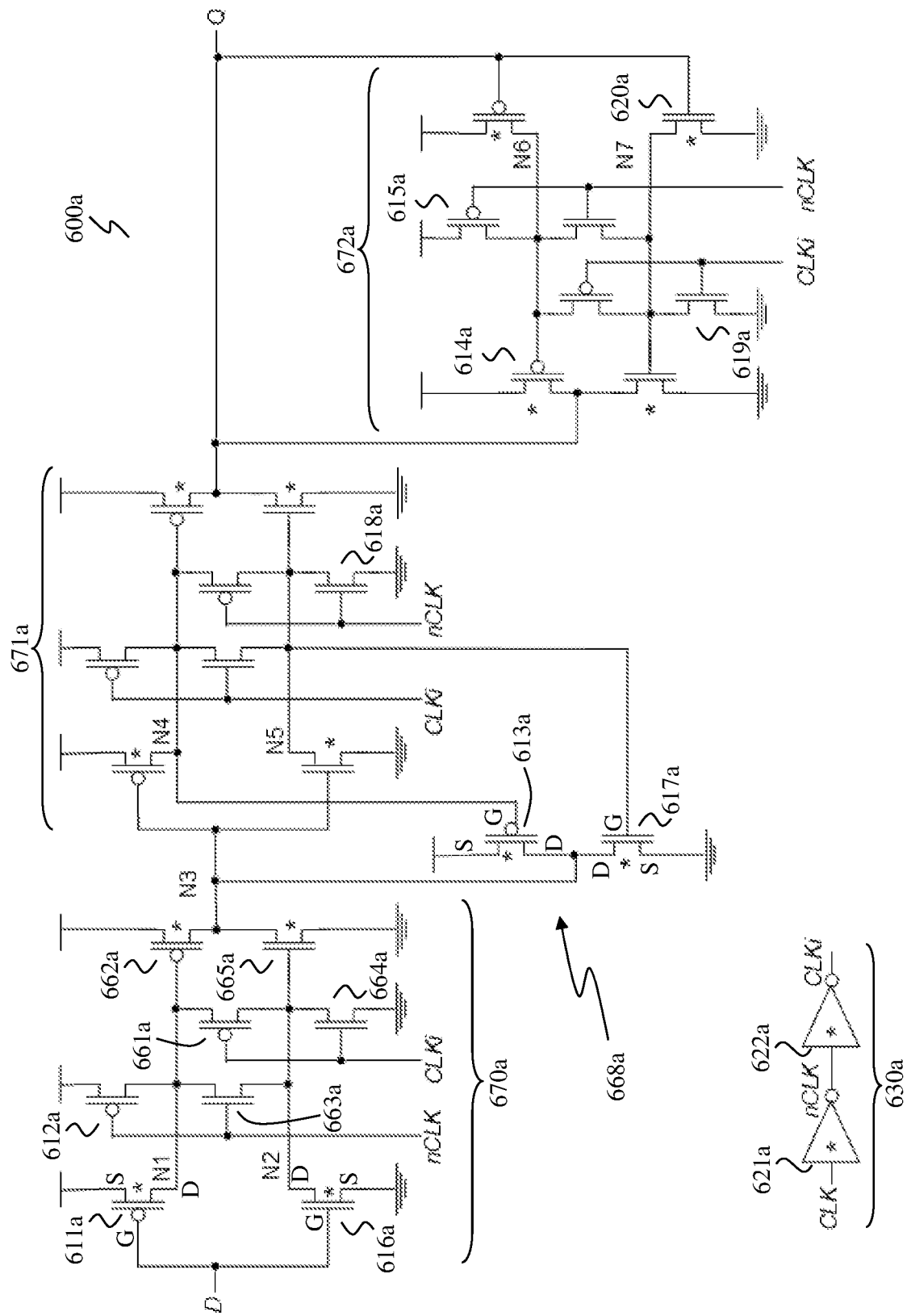
FIG. 6A shows a schematic diagram of a delay (D) flip-flop, according to various embodiments.

FIG. 6A shows a schematic diagram of a delay (D) flip-flop (DFF) 600a, according to various embodiments, illustrating a RHBD D flip-flop design. The DFF circuit 600a includes a plurality of transistors, including a plurality of PMOS transistors (represented by 611a, 612a, 613a, 614a, 615a, 661a, 662a for some PMOS transistors) and a plurality of NMOS transistors (represented by 616a, 617a, 618a, 619a, 620a, 663a, 664a, 665a for some NMOS transistors). As may be appreciated, each PMOS transistor (e.g., 611a-615a) may include a gate (G) terminal, a drain (D) terminal and a source (S) terminal. Similarly, each NMOS transistor (e.g., 616a-620a) may include a gate (G) terminal, a drain (D) terminal and a source (S) terminal. Using the PMOS transistor 613a and the NMOS transistor 617a as non-limiting examples, the gate terminal (G) of the PMOS transistor 613a is connected to a node N4, the gate terminal (G) of the NMOS transistor 617a is connected to a node N5, the source (S) terminal of the PMOS transistor 613a is connected to a power supply, the drain (D) terminal of the PMOS transistor 613a and the drain (D) terminal of the NMOS transistor 617a are connected to each other and to a node N3, and the source (S) terminal of the NMOS transistor 617a is connected to ground.

As may be observed, the plurality of transistors of the DFF circuit 600a may be arranged in a plurality of sub-circuits 670a, 671a, 672a that may be connected to each other or electrically coupled to each other. The sub-circuits 670a, 671a, 672a may be similar to each other, and each sub-circuit 670a, 671a, 672a may be as correspondingly described in the context of the circuit 570 (FIG. 5). In the DFF circuit 600a, the sub-circuits 670a, 671a may be repeat sub-circuits connected in "series", while the sub-circuit 672a may be a mirror version of the sub-circuits 670a, 671a. The PMOS transistor 613a and the NMOS transistor 617a may define a feedback sub-circuit connected to the sub-circuit 671a and to the interconnecting node N3 (or the output of the sub-circuit 670a and/or the input of the sub-circuit 671a).

In various embodiments, each sub-circuit 670a, 671a, 672a may be a tristate buffer with up-sized transistors (up-sizing will be described further below). Using the sub-circuit 670a as a non-limiting example (with the following description correspondingly applicable also to each of the sub-circuit 671a, 672a), the sub-circuit 670a may include four PMOS transistors 611a, 612a, 661a, 662a and four NMOS transistors 616a, 663a, 664a, 665a electrically coupled to each other. The gate (G) terminals of the transistors 611a, 616a may be connected to an input or input node to receive an input signal, D. The gate (G) terminals of the transistors 612a, 663a may be connected to each other for receiving a control signal or clock signal (e.g., nCLK). The gate (G) terminals of the transistors 661a, 664a may be connected to each other for receiving another control signal or clock signal (e.g., CLKi). The source (S) terminals of the transistors 611a, 612a, 662a may be connected to a power supply (e.g., $V_{DD}$), for example, to the same power supply or to respective power supplies. The source (S) terminals of the transistors 616a, 664a, 665a may be connected to ground. The drain (D) terminals of the transistors 611a, 612a, 663a, the source (S) terminal of the transistor 661a, and the gate (G) terminal of the transistor 662a may be connected to the node N1 and to each other. The drain (D) terminals of the transistors 616a, 661a, 664a, the source (S) terminal of the transistor 663a, and the gate (G) terminal of the transistor 665a may be connected to the node N2 and to each other. The drain (D) terminals of the transistors 662a, 665a may be connected to an output or output node. In the circuit 600a, the output node of the sub-circuit 670a is the node N3. The transistors 611a, 616a may define input transistors. The transistors 662a, 665a may define output transistors. The internal transistors 612a, 661a, 663a, 664a may define a control sub-circuit between the input transistors 611a, 616a and the output transistors 662a, 665a.

Figure 3A:
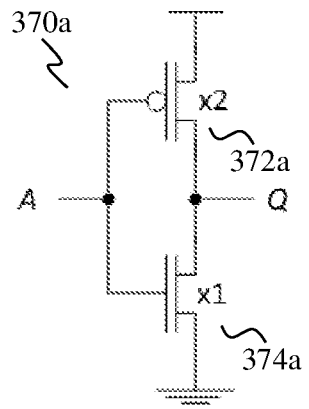
FIGS. 3A to 3C show schematic diagrams of inverters of the prior art.
Figure 3B:
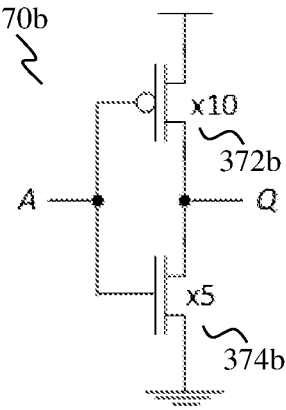
Figure 3C:
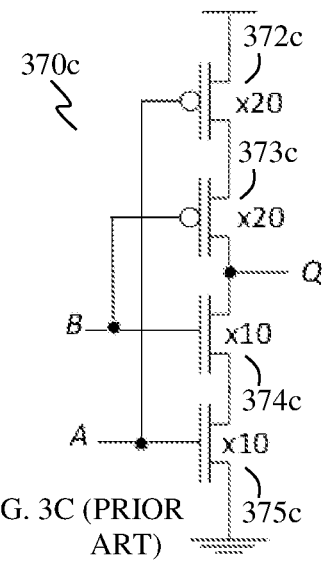

Two NOT gates 621a, 622a may be provided as a control signal sub-circuit (or clock sub-circuit) 630a to receive an input signal, CLK, and to subsequently provide control signals, nCLK and CLKi, to the relevant transistors as shown in FIG. 6A. Each of the NOT gates 621a, 622a is an inverter and may include a PMOS transistor and an NMOS transistor in an arrangement similar to the RHBD inverter 370b of FIG. 3B. Respective suitable up-sizing factors for each of the PMOS and NMOS transistors for the NOT gates 621a, 622a may be provided, not limited to a factor of ×10 for the PMOS transistor and a factor of ×5 for the NMOS transistor as illustrated in FIG. 3B.

As may be observed, there are transistors marked with an asterisk (*) (e.g., transistors 611a, 614a, 617a, 620a) where only such transistors marked with * are required to be up-sized for mitigating SEEs, and the other transistors (e.g., transistors 612a, 615a, 618a, 619a) may be sized minimally. The transistors marked with * include non-stacking transistors (e.g., transistors 614a, 662a, 665a). As some of the transistors with * are non-stacking transistors, the overall cost of transistor up-sizing may still be acceptable when compared to a full up-sizing transistor configuration for all transistors. As all the internal critical nodes (within the internal interconnection nodes N1 to N7) and the output may be protected by up-sized (large) transistors (i.e., those marked with *), hence, SEEs are unlikely to occur. A critical node may refer to a node where an adverse effect of SEEs on such a node may have the potential of changing the state of the output signal of the circuit to one that is not desirable or not in accordance with the input signal received by the circuit; in other words, an erroneous output signal. As the other transistors (without *) may be inconsequential to SEEs, their sizing may not be critical for radiation hardness (but may slightly affect the speed and power dissipation). For the circuit 600a, out of the 30 transistors provided to realize an RHBD D flip-flop, only 18 transistors (60%) may be need to be up-sized. The operations of the circuit 600a are as follows. When CLK=0, the sub-circuits 670a and 672a are in the transparent mode, the sub-circuit 671a is in the opaque mode, and the transistors 613a and 617a are off. The "transparent mode" means that the input of the sub-circuit is passed over or through to the output of the sub-circuit. The "opaque mode" means that the input of the sub-circuit is blocked from passing over or through to the output of the sub-circuit. In this case, the node N3 follows the input D, and the output Q is maintained by the sub-circuit 672a itself. When CLK=1, the sub-circuits 670a and 672a are in the opaque mode, the sub-circuit 671a is in the transparent mode, and the transistors 613a and 617a are on. In this case, the output Q follows the node N3 which is maintained by the transistors 613a and 617a.

Figure 6B:
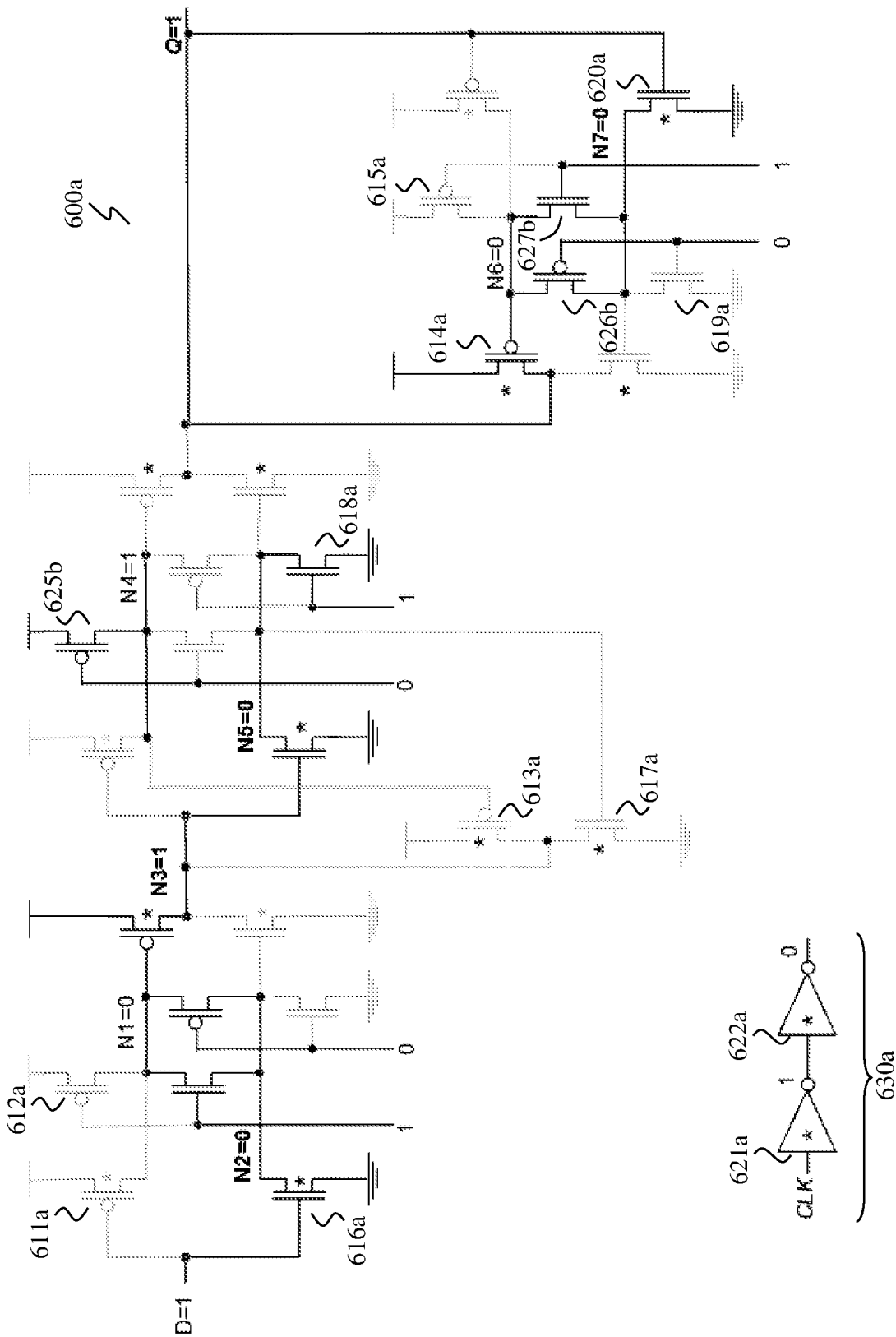
FIG. 6B shows a schematic diagram of the D flip-flop of FIG. 6A illustrating signal analysis when D=1, Clk=0, and Q=1.

To illustrate why such a transistor connection and its associated transistor up-sizing may work to mitigate SEEs, FIG. 6B shows a schematic diagram of the D flip-flop 600a illustrating signal analysis for a non-limiting example where D='1', CLK='0' and the output Q='1' (holding condition), depicting its corresponding signal levels where the ON transistors (e.g., transistors 614a, 616a) are shown in darker lines, and OFF transistors (e.g., transistors 613a, 617a) are dimmed off and shown in light-shaded lines. Under the given input conditions, the nodes and the corresponding signals, N2='0', N3='1', N5='0', N7='0' and Q='1', are strongly driven by up-sized transistors. As non-limiting examples, the node N2='0' may be driven by the up-sized NMOS transistor 616a, while the output Q='1' may be driven by the up-sized PMOS transistor 614a. These corresponding up-sized transistors relating to the nodes N2, N3, N5, N7 and Q are big, and therefore may be capable of suppressing extra charges induced due to energised particles. Other internal nodes and the corresponding signals, N1='0', N4='1' and N6='0' may not be critical and are not driven by any up-sized transistors for the given input signals. For example, the node N4='1' may be driven by the PMOS transistor 625b, while the node N6='0' may be driven by the PMOS transistor 626b and the the NMOS transistor 627b. As such, even if these nodes N1, N4 and N6 are struck by energized particles, they may be inconsequential to flip the output Q. For other sets of input signals, the same result or conclusion may result where the corresponding up-sized transistors may suppress extra charges induced due to energized particles, thereby, helping to mitigate SETs and SEUs. As a result, the D flip-flop design 600a may be radiation-hardened.

In various embodiments, the sizing of up-sized transistors may be determined based on the Linear Energy Transfer (LET) evaluation by means of the radiation simulation tool. As a non-limiting example, the LET threshold may first be defined, e.g., 10 McV·cm²/mg for the circuits of various embodiments, including, for example, the flip-flop design/circuit 600a. Thereafter, the circuit to be designed, e.g., the circuit 600a, may then be iteratively simulated by increasing the width of the up-sized transistors (e.g., from a minimum value to a larger value) until there is no SET error observed in the circuit or flip-flop. It should be appreciated that the SET evaluation may be carried at or for all the internal nodes and the output node. Following this example, the circuits of various embodiments, including the circuit 600a may sustain at least 10 McV·cm²/mg LET threshold. The error-rate may then be finally calculated based on the final transistor sizing and the NASA-standard CRÈME 96 evaluation. It should be appreciated that the LET threshold of 10 McV·cm²/mg is a non-limiting example, and various circuits may be designed for other suitable thresholds, including lower or higher than 10 McV·cm²/mg, for example, depending on applications or requirements.

An immediate effect of the RHBD D flip-flop design according to the techniques disclosed herein that may be observed is low transistor-count when compared to known RHBD flip-flops. Table 1 tabulates the normalized transistor-count (with respect to the RHBD flip-flop 600a) and the actual transistor-count values as shown in parenthesis. From Table 1, as may be observed, the RHBD design 600a merely requires additional 6 transistors (30 vs 24) when compared to the standard D flip-flops, and the radiation hardness of the RHBD design 600a may be easily enhanced through transistor up-sizing; see later. Known RHBD D flip-flops, undesirably, have 1.07× to 2.8× more transistors than the RHBD circuit 600a. In general, with more transistors adopted, the D flip-flops may feature a higher radiation hardness, but at the cost of large layout complexity and large area overheads. In this respect, the RHBD D flip-flop design 600a may provide for lower layout effort and smaller area overhead.

TABLE 1

Normalized Transistor-Count for Various D flip-flops

| D flip-flop | Normalized Number (Transistor-count) |
| --- | --- |
| Standard TG (FIG. 2A) | 0.80× (24) |
| Standard C²MOS (FIG. 2B) | 0.80× (24) |

TABLE 1-continued

Normalized Transistor-Count for Various D flip-flops

| D flip-flop | Normalized Number (Transistor-count) |
| --- | --- |
| RHBD TG with hysteresis [3] | 1.07× (32) |
| RHBD DICE version [4] | 1.13× (34) |
| RHBD F-DICE [5] | 1.30× (39) |
| RHBD interleaved flip-flop based on DICE [6] | 1.80× (54) |
| RHBD DIFF [2] | 1.67× (56) |
| RHBD filtered design [7] | 1.53× (58) |
| RHBD SC dual modular redundancy [2] | 2.00× (60) |
| RHBD TDFF [1] | 2.46× (74) |
| RHBD QC dual modular redundancy [2] | 2.80× (84) |
| RHBD design/circuit 600a (FIG. 6A) | 1.00× (30) |

[1] U.S. Pat. No. 7,719,304.
[2] H. H. K. Lee, et al., *IEEE Transactions on Nuclear Science*, vol. 58, no. 6, pp. 3026-3032, December 2011.
[3] B. Narasimham et al. *IEEE Transactions on Nuclear Science*, vol. 59, no. 6, pp. 2847-2851, December 2012.
[4] T. Lin, et al., *Proc. IEEE International Symposium on Circuits and Systems (ISCAS)*, 2016, pp. 966-969.
[5] S. Campitelli, et al., *Proc. IEEE International Symposium on Defect and Fault Tolerance in VLSI and Nanotechnology Systems (DFTS)*, 2013, pp. 107-111.
[6] M. Cabanas-Holmen et al., *IEEE Transactions on Nuclear Science*, vol. 60, no. 6, pp. 4374-4380, December 2013.
[7] U.S. Pat. No. 9,013,219.

For ease of comparison, the D flip-flop designs may be used as an example. These designs may in part include various RHBD techniques and standard commercial practices. Table 2 tabulates several characteristics, including the power (P), the delay (D), the area (A), the error-rate (E, simulated @ geosynchronous equatorial orbit (GEO)), the normalized power-delay-area (P×D×A) and the normalized power-delay-area-error-rate (P×D×A×E). These results are based on the post-layout simulations using the same 65 nm CMOS process. The normalized readings are normalized with respect to the D flip-flop 600a, where the normalized readings are with the symbol "×".

TABLE 2

Comparison among the DFFs according to different approaches

Figure 2A:
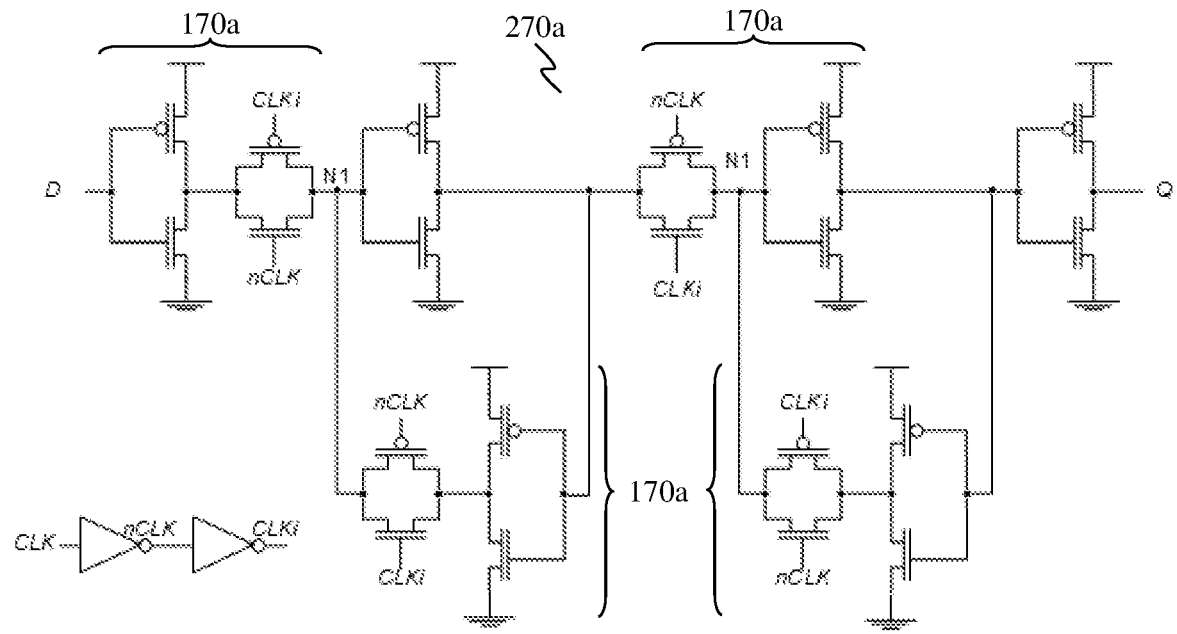
Figure 2B:
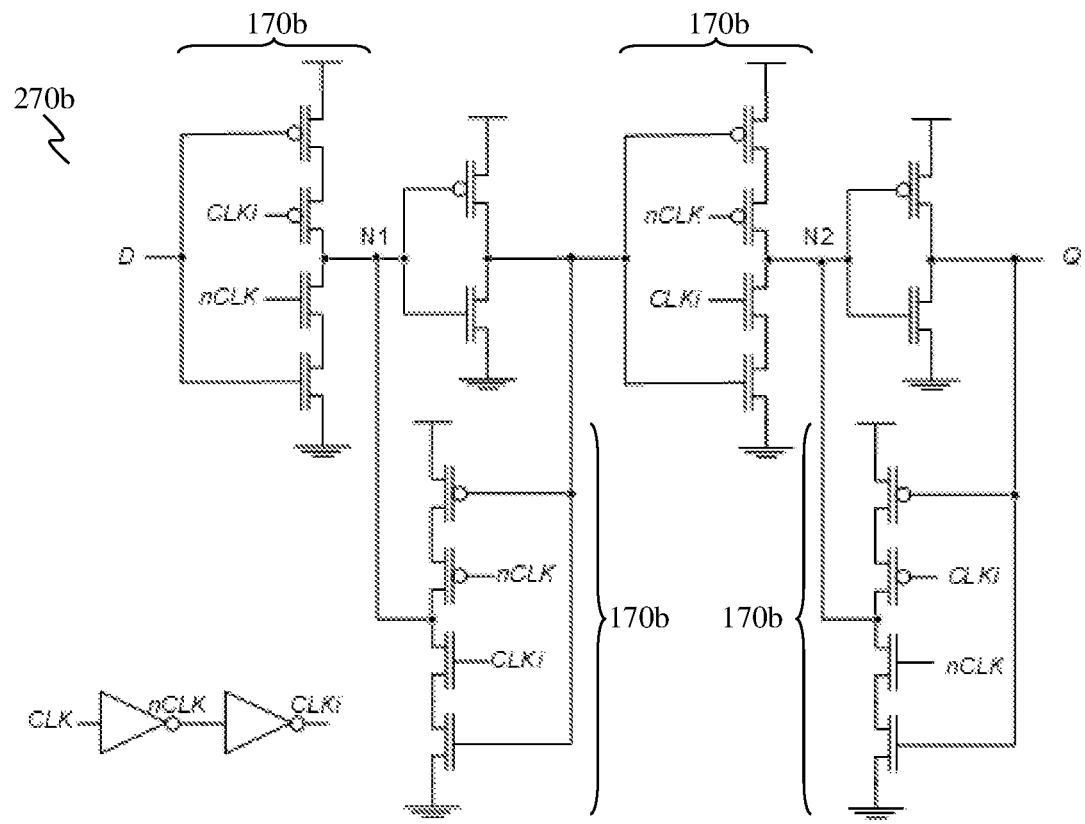
FIG. 2B shows a schematic diagram of a C²MOS flip-flop of the prior art.

| D flip-flop | Power (P), μW/100 MHz | Delay (D), ps | Area (A), μm² | Error-Rate, $10^{-10}$ | P × D × A | P × D × A × E |
| --- | --- | --- | --- | --- | --- | --- |
| Commercial | 2.1 (0.42×) | 209 (1.68×) | 10.1 (0.42×) | 505 (109×) | 0.30× | 32.70× |
| RHBD TG (up-sizing) - see FIG. 2A | 12.9 (2.61×) | 83 (0.66×) | 45.6 (1.91×) | 4.6 (1.00×) | 3.31× | 3.31× |
| RHBD DICE 1 [4] | 6.6 (1.33×) | 249 (2.00×) | 30.1 (1.29×) | 4.7 (1.02×) | 3.41× | 3.48× |
| RHBD DICE 2 [4] | 6.6 (1.39×) | 193 (1.55×) | 37.4 (1.57×) | 4.7 (1.02×) | 3.38× | 3.45× |
| Circuit 600a | 5.0 (1.00×) | 125 (1.00×) | 23.8 (1.00×) | 4.6 (1.00×) | 1.00× | 1.00× |

From Table 2, the commercial D flip-flop is the unhardened design and has the worst error rate (about 109× worse) despite its power dissipation being the lowest and its area is the smallest. However, its delay is not the best as it is not intentionally sized up to improve the speed. The commercial D flip-flop serves as the best reference to evaluate its cost when radiation hardness is considered as one of the design merits.

Without first considering the RHBD D flip-flop 600a, known RHBD practices (including the transmission-gate (TG) with the up-sizing approach, the two DICE variations), as illustrated in Table 2 as examples, improve their hardness (error-rate) by about 100× at the cost of increased power and larger area over the commercial (not RHBD) design. The power/delay/area cost is dependent on the design. For example, the TG RHBD D flip-flop has the shortest delay, while the DICE-based D flip-flops have longer delays. Put simply, the composite P×D×A cost of the known RHBD D flip-flops is about 10× larger than that of the commercial D flip-flop. Similarly, known RHBD D flip-flops have 10× composite P×D×A×E merit than the commercial D flip-flop.

Taking into consideration now the RHBD D flip-flop 600a of various embodiments for comparison. When compared to the RHBD D flip-flop 600a, known RHBD D flip-flops dissipate higher power, suffer from longer delay (except for the TG RHBD D flip flop) and occupy larger area. Based on the composite P×D×A and P×D×A×E merits, the known RHBD D flip-flops are more than 3.31× to 3.48× worse. Therefore, it should be appreciated that the RHBD D flip-flop according to the techniques disclosed herein may outperform known RHBD D flip-flops.

The techniques disclosed herein may be applied in various circuits, including different types of circuits. Various sequential logic circuits may be implemented, including but not limited to various latches and flip-flops which may similarly be designed. Some non-limiting examples of sequential logic designs will be described below, with reference to the corresponding figures. In the relevant figures, the transistors, inverters and gates with asterisks may be required to be up-sized to mitigate or suppress SEEs/SETs.

Figure 6C:
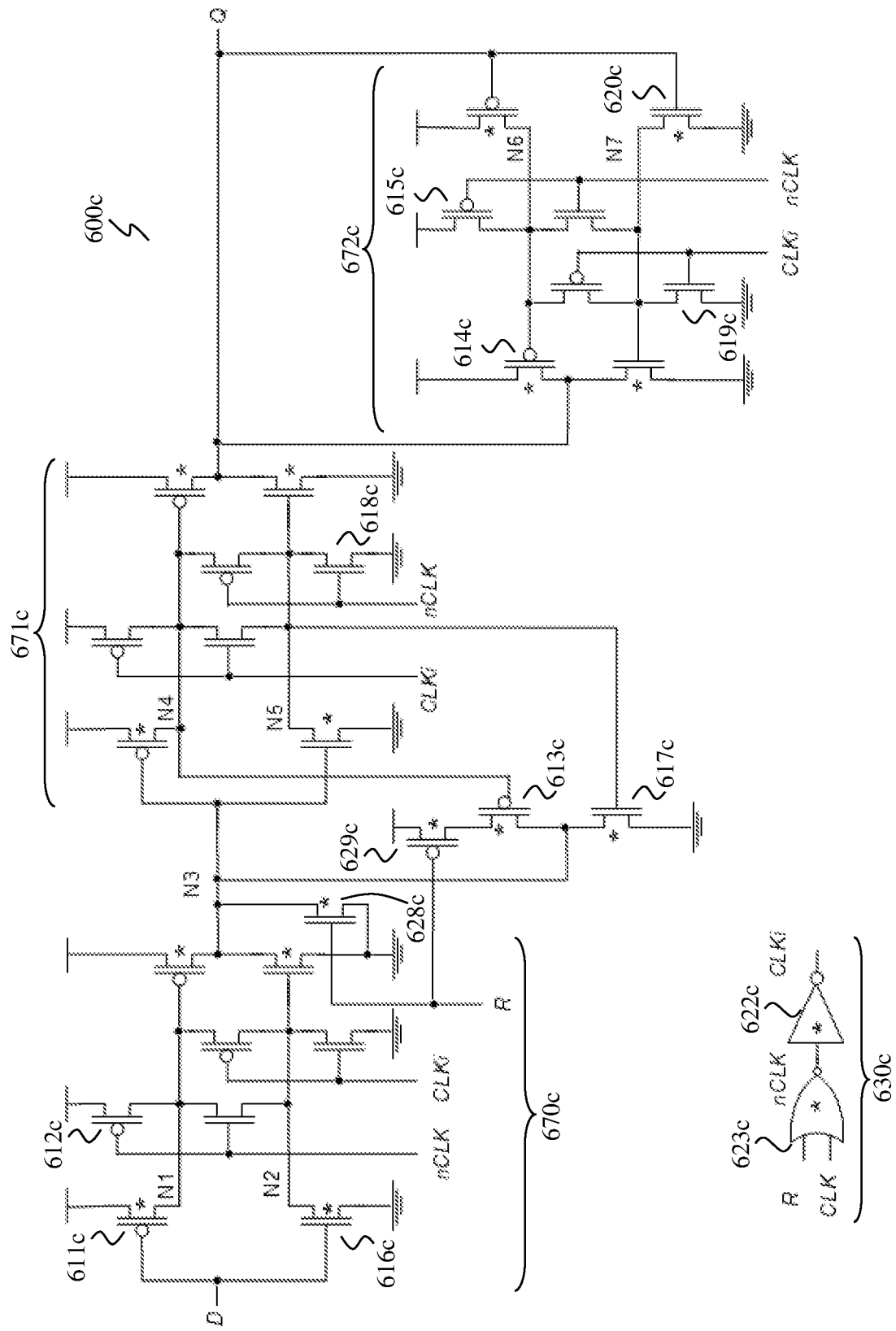
FIG. 6C shows a schematic diagram of a delay (D) flip-flop with positive reset (R), according to various embodiments.
Figure 6D:
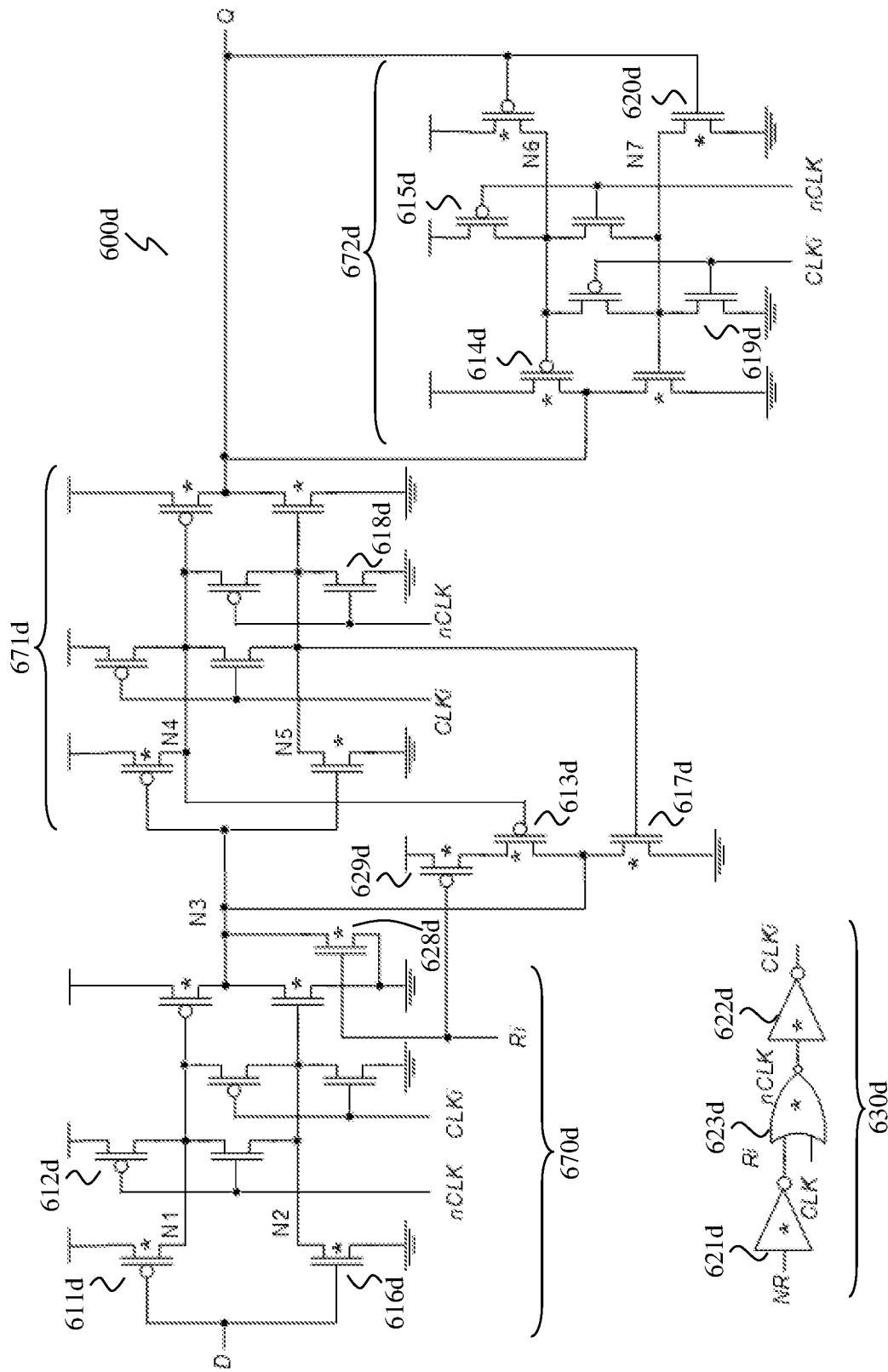
FIG. 6D shows a schematic diagram of a delay (D) flip-flop with negative reset (NR), according to various embodiments.

FIGS. 6C and 6D show schematic diagrams of a delay (D) flip-flop with positive reset (R) 600c and a delay (D) flip-flop with negative reset (NR) 600d respectively. Each of the D flip-flop circuits 600c, 600d may be similar to each other, and includes a plurality of transistors, including a plurality of PMOS transistors (represented by 611c-615c and 611d-615d for some PMOS transistors) and a plurality of NMOS transistors (represented by 616c-620c and 616d-620d for some NMOS transistors). As may be appreciated, each PMOS transistor and each NMOS transistor of the circuits 600c, 600d, including their associated terminals, may be as described above in the context of the circuit 600a (FIG. 6A).

The flip-flop circuits 600c, 600d may be similar to the D flip-flop circuit 600a (FIG. 6A), except that each circuit 600c, 600d includes an additional NMOS transistor 628c, 628d, and an additional PMOS transistor 629c, 629d. The transistors 628c, 629c, together with the transistors 613c, 617c, may define a feedback sub-circuit for the circuit 600c, while the transistors 628d, 629d, together with the transistors 613d, 617d, may define a feedback sub-circuit for the circuit 600d. Further, each circuit 600c, 600d has a respective control signal sub-circuit (or clock sub-circuit) 630c, 630d that is different to each other and also to the control signal sub-circuit 630a (FIG. 6A). The plurality of transistors of the D flip-flop circuits 600c, 600d may be arranged in a plurality of sub-circuits 670c, 671c, 672c (for circuit 600c), and 670d, 671d, 672d (for circuit 600d) similar to the sub-circuits 670a, 671a, 672a of the D flip-flop circuit 600a, and may be as described in the context of the sub-circuit 670a (or the circuit 570).

As may be observed, there are transistors marked with an asterisk (*) (e.g., transistors 616c, 616d, 629c, 629d) where only such transistors marked with * are required to be up-sized for mitigating SEEs, and the other transistors (e.g., transistors 612c, 612d, 618c, 618d) may be sized minimally. The transistors marked with * include non-stacking transistors (e.g., transistors 614c, 614d). The two transistors 613c and 629c, and 613d and 629d, may be stacking transistors. As all the internal critical nodes (within the internal interconnection nodes N1 to N7) and the output may be protected by up-sized (large) transistors (i.e., those marked with *), hence, SEEs are unlikely to occur. As the other transistors (without *) may be inconsequential to SEEs, their sizing may not be critical for radiation hardness (but may slightly affect the speed and power dissipation).

For the circuit 600c, the control signal sub-circuit 630c includes a NOR gate 623c and a NOT gate 622c connected to each other. The NOR gate 623c receives a positive reset (R) signal and another input signal, CLK, and to subsequently output a control (or clock) signal, nCLK, which may then be received by the NOT gate 622c which, in turn, subsequently outputs another control signal or clock signal, CLKi. The positive reset (R) signal and the control signals, nCLK and CLKi, are provided to the relevant transistors as shown in FIG. 6C. The NOT gate 622c may include a PMOS transistor and an NMOS transistor in an arrangement similar to the RHBD inverter 370b of FIG. 3B, with suitable up-sizing factors.

For the circuit 600d, the control signal sub-circuit 630d includes two NOT gates 621d, 622d, and a NOR gate 623d in between. The NOT gate 621d may receive a negative reset (NR) signal as an input signal, and to subsequently provide an output signal, Ri, which together with another input signal, CLK, are received by the NOR gate 623d. The NOR gate 623d then outputs a control signal, nCLK, which may then be received by the NOT gate 622d which, in turn, subsequently outputs another control signal, CLKi. The signal, Ri, and the control signals, nCLK and CLKi, are provided to the relevant transistors as shown in FIG. 6D. Each of the NOT gates 621d, 622d may include a PMOS transistor and an NMOS transistor in an arrangement similar to the RHBD inverter 370b of FIG. 3B, with suitable up-sizing factors.

For the circuit 600c, when R=1 such that nCLK=0 and CLKi=1 (regardless of the clock signal CLK), the sub-circuits 670c and 672c are in the opaque mode, and the sub-circuit 671c is in the transparement mode. The logic '1' R signal turns on the NMOS transistor 628c to make the node N3 to 0, and turns off the PMOS transistor 629c. Since the sub-circuit 671c is in the transparement mode, the output Q becomes 0, and the circuit 600c is now in the reset mode. When R=0, the circuit 600c operates essentially the same as the D flip-flip 600a (FIG. 6A).

For the circuit 600d, when NR=0 such that nCLK=0 and CLKi=1 (regardless of the clock signal CLK), the sub-circuits 670d and 672d are in the opaque mode, and the sub-circuit 671d is in the transparement mode. The logic '0' NR signal inverts Ri to 1, turning on the NMOS transistor 628d to make the node N3 to 0, and turns off the PMOS transistor 629d. Since the sub-circuit 671d is in the transparement mode, the output Q becomes 0, and the circuit 600d is now in the reset mode. When NR=1, the circuit 600d operates essentially the same as the D flip-flip 600a (FIG. 6A).

Figure 6E:
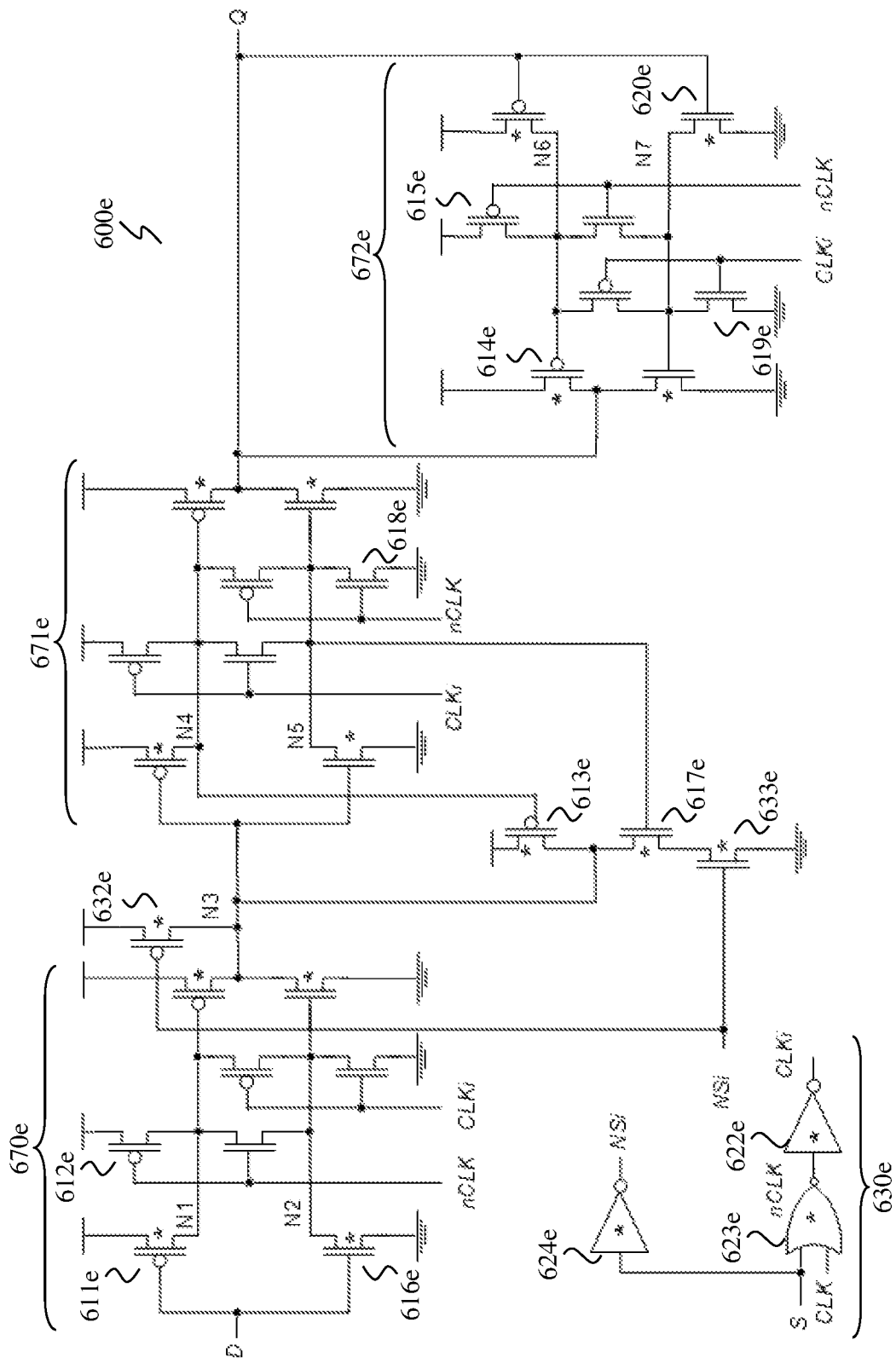
FIG. 6E shows a schematic diagram of a delay (D) flip-flop with positive set (S), according to various embodiments.
Figure 6F:
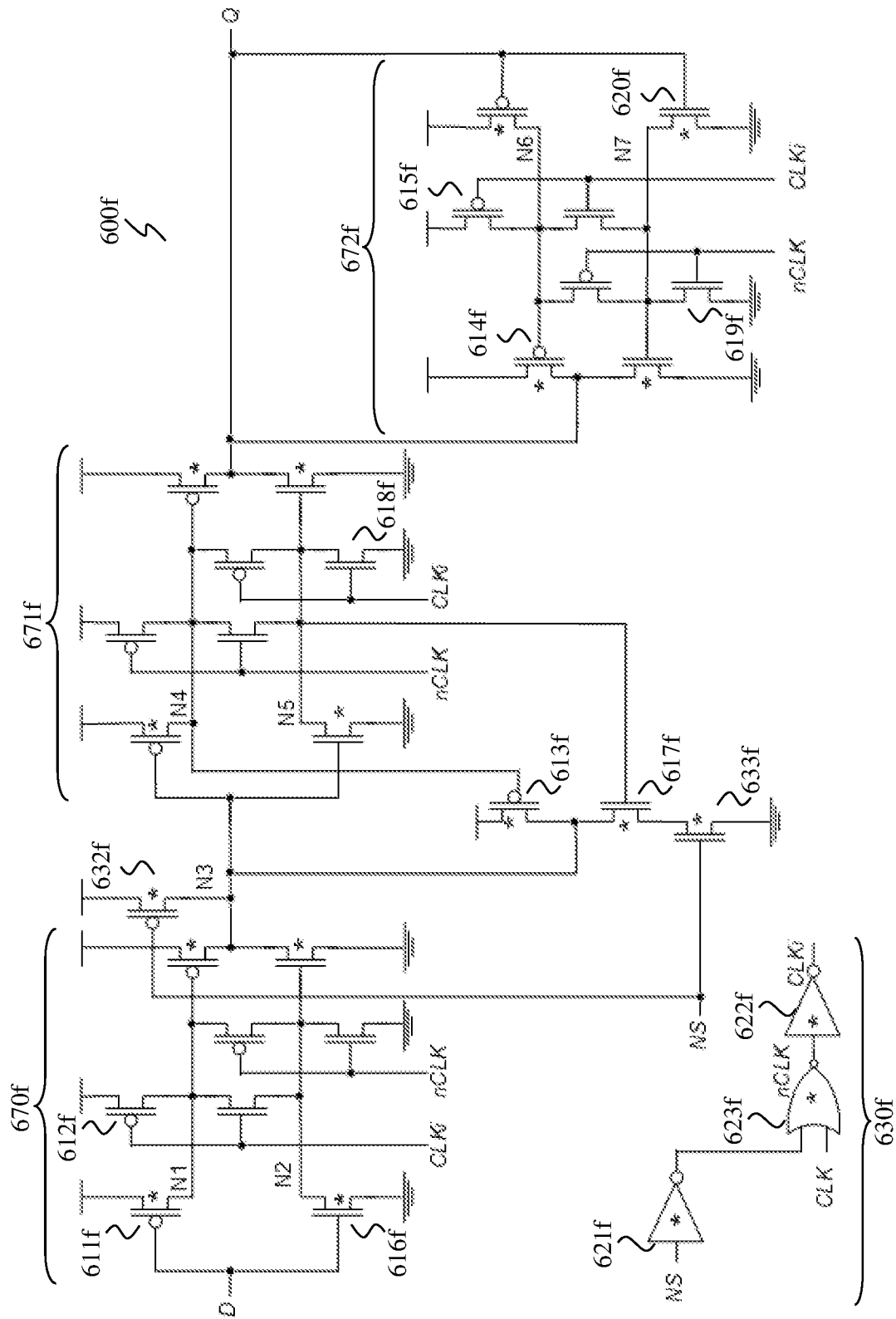
FIG. 6F shows a schematic diagram of a delay (D) flip-flop with negative set (NS), according to various embodiments.

FIGS. 6E and 6F show schematic diagrams of a delay (D) flip-flop with positive set (S) 600e, and a delay (D) flip-flop with negative set (NS) 600f respectively. Each of the D flip-flop circuits 600e, 600f may be similar to each other, and includes a plurality of transistors, including a plurality of PMOS transistors (represented by 611e-615e and 611f-615f for some PMOS transistors) and a plurality of NMOS transistors (represented by 616e-620e and 616f-620f for some NMOS transistors). As may be appreciated, each PMOS transistor and each NMOS transistor of the circuits 600e, 600f, including their associated terminals, may be as described above in the context of the circuit 600a (FIG. 6A).

The flip-flop circuits 600e, 600f may be similar to the D flip-flop circuit 600a (FIG. 6A), except that each circuit 600e, 600f includes an additional PMOS transistor 632e, 632f, and an additional NMOS transistor 633e, 633f. The transistors 632e, 633e, together with the transistors 613e, 617e, may define a feedback sub-circuit for the circuit 600e, while the transistors 632f, 633f, together with the transistors 613f, 617f, may define a feedback sub-circuit for the circuit 600f. Further, each circuit 600e, 600f may have a respective control signal sub-circuit (or clock sub-circuit) 630e, 630f that is different to each other and also to the control signal sub-circuit 630a (FIG. 6A). The plurality of transistors of the D flip-flop circuit 600e, 600f may be arranged in a plurality of sub-circuits 670e, 671e, 672e (for circuit 600e) and 670f, 671f, 672f (for circuit 6000 similar to the sub-circuits 670a, 671a, 672a of the DFF circuit 600a, and may be as described in the context of the sub-circuit 670a (or the circuit 570).

As may be observed, there are transistors marked with an asterisk (*) (e.g., transistors 617e, 617f, 632e, 6320 where only such transistors marked with * are required to be up-sized for mitigating SEEs, and the other transistors (e.g., transistors 612e, 612f, 618e, 6180 may be sized minimally. The transistors marked with * include non-stacking transistors (e.g., transistors 614e, 614f). The two transistors 617e and 633e, and 617f and 633f, may be stacking transistors. As all the internal critical nodes (within the internal interconnection nodes N1 to N7) and the output may be protected by up-sized (large) transistors (i.e., those marked with *), hence, SEEs are unlikely to occur. As the other transistors (without *) may be inconsequential to SEEs, their sizing may not be critical for radiation hardness (but may slightly affect the speed and power dissipation).

For the circuit 600e, the control signal sub-circuit 630e includes a NOT gate 624e that receives a positive set (S) signal and, in turn, provides an output signal, NSi. The control signal sub-circuit 630e may further include a NOR gate 623e and a second NOT gate 622e connected to each other. The NOR gate 623e may be connected to the NOT gate 624e and may receive a positive set (S) signal, and another input signal, CLK, where the NOR gate 623e may subsequently output a control signal, nCLK, which may then be received by the NOT gate 622e which, in turn, subsequently outputs another control signal, CLKi. The signal, NSi, and the control signals, nCLK and CLKi, are provided to the relevant transistors as shown in FIG. 6E. Each of the NOT gates 622e, 624e may include a PMOS transistor and an NMOS transistor in an arrangement similar to the RHBD inverter 370b of FIG. 3B, with suitable up-sizing factors.

For the circuit 600f, the control signal sub-circuit 630f includes two NOT gates 621f, 622f, and a NOR gate 623f in between. The NOT gate 621f may receive a negative set (NS) signal as an input signal, and to subsequently provide an output signal, which together with an input signal, CLK, are received by the NOR gate 623f. The NOR gate 623f then outputs a control signal, nCLK, which may then be received by the NOT gate 622f which, in turn, subsequently outputs another control signal, CLKi. The negative set (NS) signal and the control signals, nCLK and CLKi, are provided to the relevant transistors as shown in FIG. 6F. Each of the NOT gates 621f, 622f may include a PMOS transistor and an NMOS transistor in an arrangement similar to the RHBD inverter 370b of FIG. 3B, with suitable up-sizing factors.

For the circuit 600e, when S=1 such that NSi=0, nCLK=0 and CLKi=1 (regardless of the clock signal CLK), the sub-circuits 670e and 672e are in the opaque mode, and the sub-circuit 671e is in the transparent mode. The logic '0' NSi signal turns on the PMOS transistor 632e to make the node N3 to 1, and turns off the NMOS transistor 633e. Since the sub-circuit 671e is in the transparent mode, the output Q becomes 1, and the circuit 600e is now in the set mode. When S=0, the circuit 600e operates essentially the same as the D flip-flip 600a (FIG. 6A).

For the circuit 600f, when NS=0 such that nCLK=0 and CLKi=1 (regardless of the clock signal CLK), the sub-circuits 670f and 672f are in the opaque mode, and the sub-circuit 671f is in the transparement mode. The logic '0' NS signal turns on the PMOS transistor 632f to make the node N3 to 1, and turns off the NMOS transistor 633f. Since the sub-circuit 671f is in the transparent mode, the output Q becomes 1, and the circuit 600f is now in the set mode. When NS=1, the circuit 600e operates essentially the same as the D flip-flip 600a (FIG. 6A).

Figure 7A:
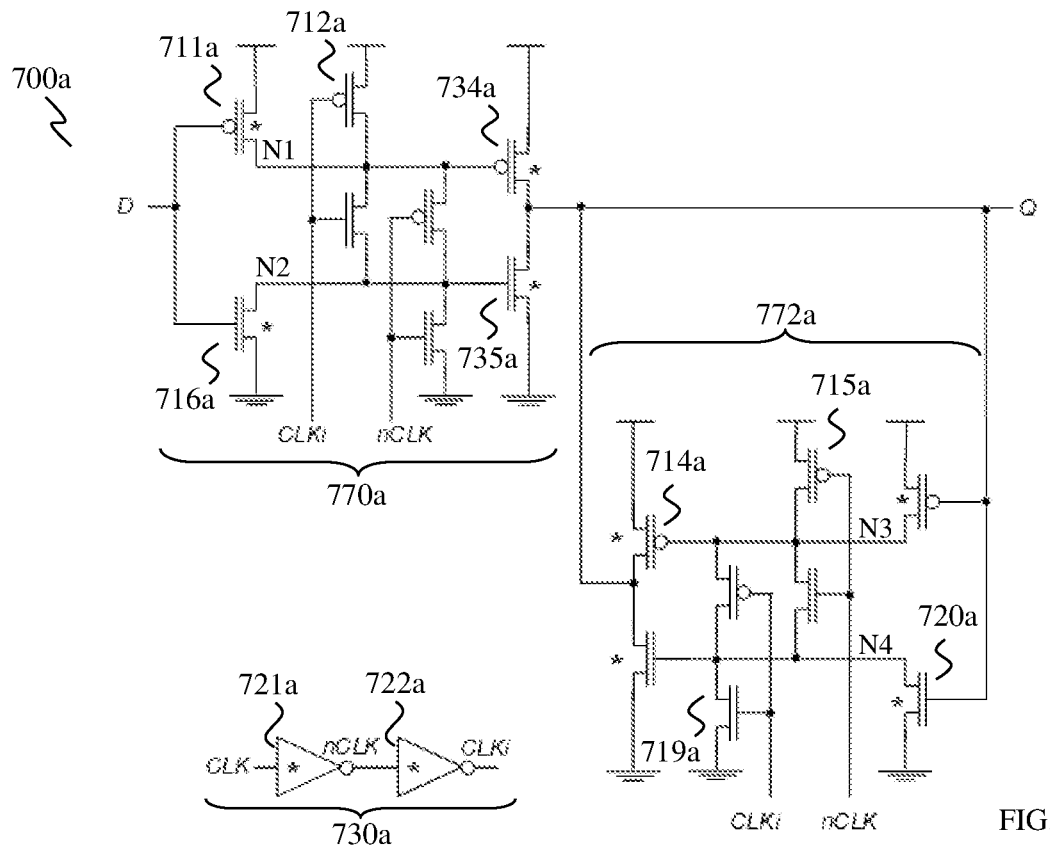
FIG. 7A shows a schematic diagram of a positive latch circuit, according to various embodiments.
Figure 7B:
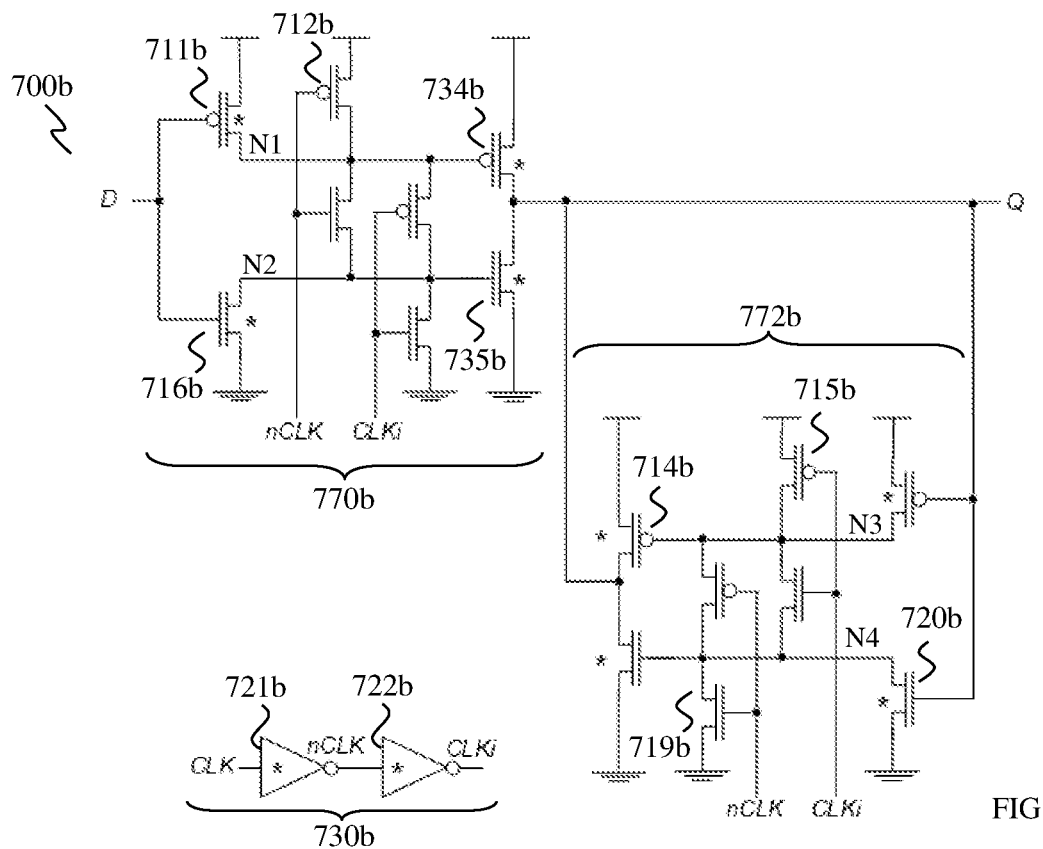
FIG. 7B shows a schematic diagram of a negative latch circuit, according to various embodiments.

FIGS. 7A and 7B illustrate latch designs of various embodiments, where FIG. 7A shows a schematic diagram of a positive latch circuit 700a, while FIG. 7B shows a schematic diagram of a negative latch circuit 700b.

Each of the circuits 700a, 700b includes a plurality of transistors, including a plurality of PMOS transistors (represented by 711a, 712a, 714a, 715a, 734a, 711b, 712b, 714b, 715b, 734b for some PMOS transistors) and a plurality of NMOS transistors (represented by 716a, 719a, 720a, 735a, 716b, 719b, 720b, 735b for some NMOS transistors). As may be appreciated, each PMOS transistor and each NMOS transistor of the circuits 700a, 700b, including their associated terminals, may be as described above in the context of the circuit 600a (FIG. 6A).

The plurality of transistors of the circuits 700a, 700b may be arranged in a plurality of sub-circuits 770a, 772a, 770b, 772b. The sub-circuits 770a, 770b may be similar to the sub-circuits 670a, 671a, of the D flip-flop circuit 600a, while the sub-circuits 772a, 772b may be similar to the sub-circuit 672a of the D flip-flop circuit 600a, and may be as described in the context of the sub-circuit 670a (or the circuit 570).

As may be observed, there are transistors marked with an asterisk (*) (e.g., transistors 711a, 711b, 720a, 720b, 734a, 734b) where only such transistors marked with * are required to be up-sized for mitigating SEEs, and the other transistors (e.g., transistors 712a, 712b, 719a, 719b) may be sized minimally. The transistors marked with * include non-stacking transistors (e.g., transistors 714a, 734a, 735a, 714b, 734b, 735b). As all the internal critical nodes (within the internal interconnection nodes N1 to N4) and the output may be protected by up-sized (large) transistors (i.e., those marked with *), hence, SEEs are unlikely to occur. As the other transistors (without *) may be inconsequential to SEEs, their sizing may not be critical for radiation hardness (but may slightly affect the speed and power dissipation).

For each of the circuits 700a, 700b, two NOT gates 721a, 722a and 721b, 722b may be provided, connected to each other, to define a control signal sub-circuit (or clock sub-circuit) 730a, 730b to receive an input signal, CLK, and to subsequently provide control (or clock) signals, nCLK and CLKi, to the relevant transistors as shown in FIGS. 7A and 7B. Each of the NOT gates 721a, 722a, 721b, 722b is an inverter and may include a PMOS transistor and an NMOS transistor in an arrangement similar to the RHBD inverter 370b of FIG. 3B, with suitable up-sizing factors.

As may be appreciated, the circuits 700a, 700b may be similar in configuration or may have similar arrangement of transistors, except for the difference in the control signals, nCLK and CLKi, provided to the relevant transistors. As a non-limiting example, the control signal, CLKi, may be provided to the gate terminal of the PMOS transistor 712a for the positive latch circuit 700a, while the control signal, nCLK, may be provided to the gate terminal of the corresponding PMOS transistor 712b for the negative latch circuit 700b.

For the circuit 700a, when CLK=1 such that nCLK=0 and CLKi=1, the sub-circuit 770a is in the opaque mode, and the sub-circuit 772a is in the transparement mode. The logic of the output Q is held by the sub-circuit 772a. When CLK=0, the sub-circuits 770a is in the transparent mode, and the sub-circuit 772a is in the opaque mode. The logic of the output Q follows the input D. The operation of the circuit 700b is similar to that of the circuit 700a, except in this case, the output Q follows the input D when CLK=1, otherwise the output Q is held by the sub-circuit 772b when CLK=0.

Figure 8:
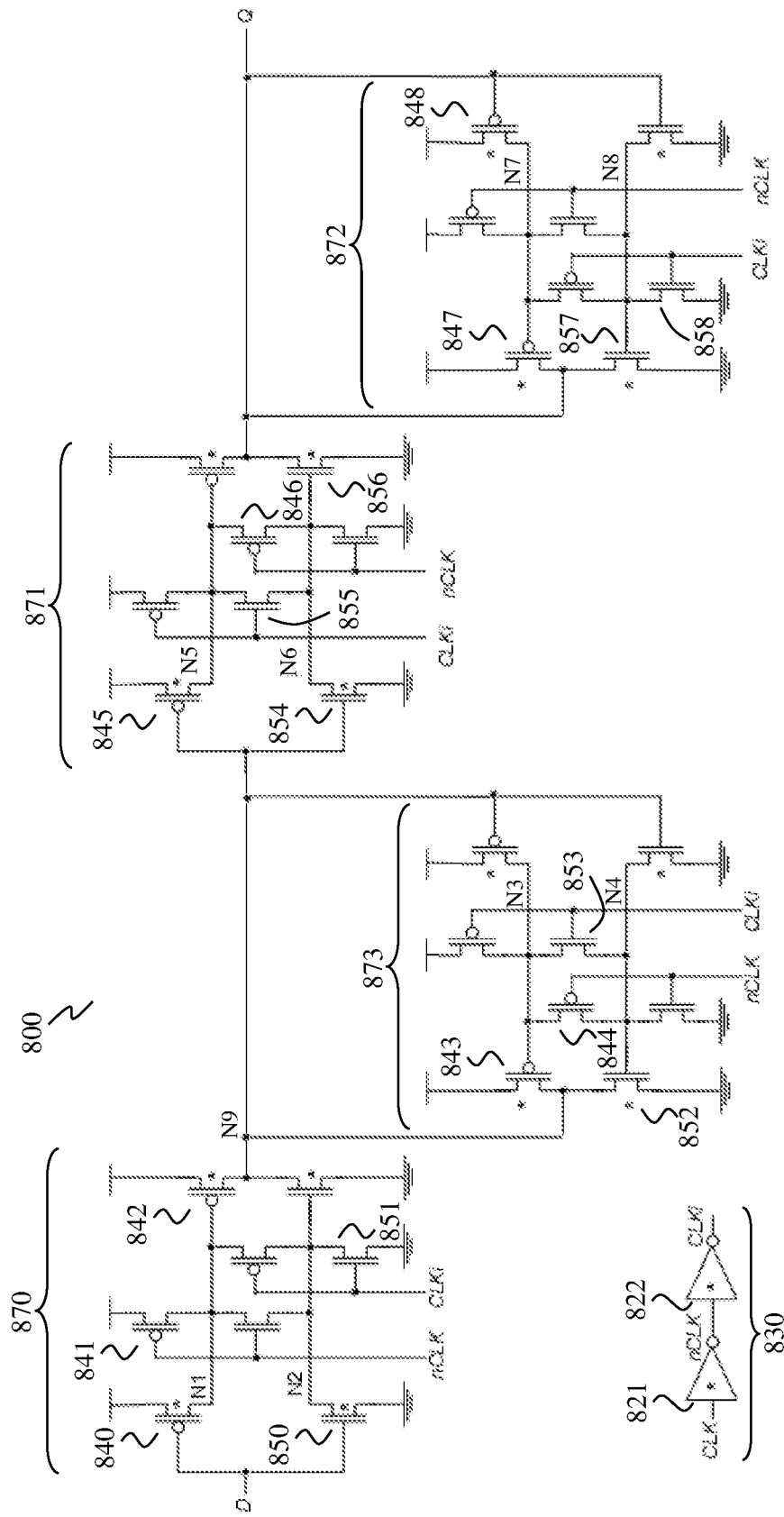
FIG. 8 shows a schematic diagram of a delay (D) flip-flop, according to various embodiments.

FIG. 8 shows a schematic diagram of a delay (D) flip-flop 800, according to various embodiments. The D flip-flop circuit 800 includes a plurality of transistors, including a plurality of PMOS transistors (represented by 840-848 for some PMOS transistors) and a plurality of NMOS transistors (represented by 850-858 for some NMOS transistors). As may be appreciated, each PMOS transistor and each NMOS transistor of the circuit 800 including their associated terminals, may be as described above in the context of the circuit 600a (FIG. 6A).

The plurality of transistors of the circuit 800 may be arranged in a plurality of sub-circuits 870-873. The sub-circuits 870, 871 may be similar to the sub-circuits 670a, 671a of the D flip-flop circuit 600a, while the sub-circuits 872, 873 may be similar to the sub-circuit 672a of the D flip-flop circuit 600a, and may be as described in the context of the sub-circuit 670a (or the circuit 570). The sub-circuits 870, 873 may define a first sub-circuit arrangement while the sub-circuits 871, 872 may define a second sub-circuit arrangement, where each sub-circuit arrangement may be a latch.

As may be observed, there are transistors marked with an asterisk (*) (e.g., transistors 840, 843, 845, 850, 854, 857) where only such transistors marked with * are required to be up-sized for mitigating SEEs, and the other transistors (e.g., transistors 841, 846, 851, 853, 855) may be sized minimally. The transistors marked with * include non-stacking transistors (e.g., transistors 842, 843, 852, 856). As all the internal critical nodes (within the internal interconnection nodes N1 to N9) and the output may be protected by up-sized (large) transistors (i.e., those marked with *), hence, SEEs are unlikely to occur. As the other transistors (without *) may be inconsequential to SEEs, their sizing may not be critical for radiation hardness (but may slightly affect the speed and power dissipation).

Two NOT gates 821, 822 may be provided, connected to each other, as a control signal sub-circuit (or clock sub-circuit) 830 to receive an input signal, CLK, and to subsequently provide control signals, nCLK and CLKi, to the relevant transistors as shown in FIG. 8. Each of the NOT gates 821, 822 is an inverter and may include a PMOS transistor and an NMOS transistor in an arrangement similar to the RHBD inverter 370b of FIG. 3B, with suitable up-sizing factors.

For the circuit 800, when CLK=1 such that nCLK=0 and CLKi=1, the sub-circuits 870 and 872 are in the opaque mode, and the sub-circuits 871 and 873 are in the transparement mode. The signal on node N9 is held by the sub-circuit 873, and is passed over to the output Q. When CLK=0 such that nCLK=1 and CLKi=0, the sub-circuits 870 and 872 are in the transparent mode, and the sub-circuits 871 and 873 are in the opaque mode. The input D is passed over to the node N9, and the output Q is held by the sub-circuit 872.

It should be appreciated that the technique disclosed herein may easily be applied to design any sequential logic (e.g., one or more latches, flip-flops or state-holding circuits) or other circuits. Any modifications, including the change of transistor configuration, may be made without deviating from the conceptual consideration or idea where the critical nodes may be driven by up-sized transistors (including non-stacking up-sized) transistors to suppress the SEEs.

As described above, in the context of various embodiments, a circuit may be provided, where at least some or only some of the transistors of the circuit may be up-sized for mitigating SEEs. The circuit may be a tristate buffer. There may also be provided one or more circuit arrangements (for example, digital logic circuits, e.g., sequential logic circuit), where each circuit arrangement may have a plurality of sub-circuits electrically coupled to each other, where at least one of the sub-circuits may be the circuit (e.g., tristate buffer with up-sized transistors) described above. In some embodiments, each sub-circuit of the plurality of sub-circuits may be the circuit (e.g., tristate buffer with up-sized transistors) described above.

Various embodiments may be employed in various applications, including but not limited to circuits/systems for S&S applications and high-rel applications. For example, one possible application pertains to S&S applications. In space, radiation effects are severe, and various embodiments may help satellite applications (e.g., pico-satellites, nano-satellites, macro-satellites in Low-Earth-Orbit (LEO), and big satellites in GEO) to mitigate SEEs, hence, making these satellites more versatile and extending their life-span. Another possible application pertains to automotive industry, for example, autonomous cars. For autonomous cars, the error rates of digital circuits must be very low for safety concern, where the techniques disclosed herein may help to address this concern. A third possible application pertains to high-rel medical applications. For example, implantable electronic devices require high reliability for safety concern, where the techniques disclosed herein may help to address this concern. Nevertheless, it should be appreciated that the techniques disclosed herein and the various embodiments may also be employed in various other applications, including applications where reliability may be an issue.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit comprising:
a first set of transistors configured to receive one or more input signals provided to the circuit; and
a second set of transistors electrically coupled to each other, wherein the second set of transistors is configured to provide one or more output signals of the circuit,
wherein the first set of transistors and the second set of transistors are electrically coupled to each other, and
wherein, for each transistor of the first set of transistors and the second set of transistors, the transistor is configured to drive a load associated with the transistor and has an aspect ratio that is sized larger than an aspect ratio of a transistor that is optimized for driving the load,
wherein each transistor of the second set of transistors is a non-stacking transistor.

2. The circuit as claimed in claim 1, wherein the aspect ratio is at least 2.5.

3. The circuit as claimed in claim 1, wherein, for each transistor of the first set of transistors and the second set of transistors, the aspect ratio is designed to increase a linear energy transfer threshold of the circuit.

4. The circuit as claimed in claim 3, wherein the linear energy transfer threshold of the circuit is at least 1 MeV·cm$^2$/mg.

5. The circuit as claimed in claim 1, wherein the first set of transistors comprises at least one pair of stacking transistors.

6. A circuit comprising:
a first set of transistors configured to receive one or more input signals provided to the circuit; and
a second set of transistors electrically coupled to each other, wherein the second set of transistors is configured to provide one or more output signals of the circuit,
wherein the first set of transistors and the second set of transistors are electrically coupled to each other,
wherein, for each transistor of the first set of transistors and the second set of transistors, the transistor is configured to drive a load associated with the transistor and has an aspect ratio that is sized larger than an aspect ratio of a transistor that is optimized for driving the load,
wherein a drain terminal of a transistor of the first set of transistors is connected to a gate terminal of a transistor of the second set of transistors, the transistors being of first conductivity type, and
wherein a drain terminal of another transistor of the first set of transistors is connected to a gate terminal of another transistor of the second set of transistors, the other transistors being of second conductivity type and opposite to the first conductivity type.

7. The circuit as claimed in claim 6, wherein the aspect ratio is at least 2.5.

8. The circuit as claimed in claim 6, wherein, for each transistor of the first set of transistors and the second set of transistors, the aspect ratio is designed to increase a linear energy transfer threshold of the circuit.

9. A circuit comprising:
a first set of transistors configured to receive one or more input signals provided to the circuit;
a second set of transistors electrically coupled to each other, wherein the second set of transistors is configured to provide one or more output signals of the circuit; and a control sub-circuit electrically coupled to the first set of transistors and the second set of transistors, the control sub-circuit being configured to receive one or more control signals provided to the circuit;
wherein the first set of transistors and the second set of transistors are electrically coupled to each other,
wherein, for each transistor of the first set of transistors and the second set of transistors, the transistor is configured to drive a load associated with the transistor and has an aspect ratio that is sized larger than an aspect ratio of a transistor that is optimized for driving the load, and
wherein the control sub-circuit comprises one or more transistors configured to, in response to the one or more control signals received, control an electrical signal flow from the first set of transistors to the second set of transistors.

10. The circuit as claimed in claim 9, wherein the aspect ratio is at least 2.5.

11. A method for sizing an aspect ratio of transistors of a circuit to increase a linear energy transfer threshold of the circuit due to ionization at different nodes of the circuit, the method comprising:
arranging a first set of transistors of the circuit to receive one or more input signals provided to the circuit, the first set of transistors comprising:
a first transistor whose aspect ratio is enlarged to charge its output node to absorb the ionization at the output node; and
a second transistor whose aspect ratio is enlarged to discharge its output node to absorb the ionization at the output node;
arranging a second set of transistors of the circuit to output one or more output signals of the circuit, the second set of transistors comprising:
a third transistor whose aspect ratio is enlarged to charge its output node to absorb the ionization at the output node; and
a fourth transistor whose aspect ratio is enlarged to discharge its output node to absorb the ionization at the output node; and
arranging a third set of transistors configured as a control sub-circuit electrically coupled to the first set of transistors and the second set of transistors, wherein the control sub-circuit is configured to receive one or more control signals.

12. The method as claimed in claim 11, wherein, for each of the first, second, third and fourth transistors, the aspect ratio of the transistor is enlarged by increasing the aspect ratio to at least 2.5.

13. A circuit arrangement comprising:
a plurality of sub-circuits electrically coupled to each other, wherein each sub-circuit of the plurality of sub-circuits comprises:
a first set of transistors configured to receive one or more input signals provided to the sub-circuit; and
a second set of transistors electrically coupled to each other, wherein the second set of transistors is configured to provide one or more output signals of the sub-circuit,
wherein the first set of transistors and the second set of transistors are electrically coupled to each other, and
wherein, for each transistor of the first set of transistors and the second set of transistors, the transistor is configured to drive a load associated with the transistor and has an aspect ratio that is sized larger than an aspect ratio of a transistor that is optimized for driving the load,
wherein the plurality of sub-circuits comprise at least two sub-circuits connected in series to each other,
wherein the at least two sub-circuits comprise a first sub-circuit and a second sub-circuit connected in series to each other; and
the circuit arrangement further comprises a feedback sub-circuit,
wherein an output of the feedback sub-circuit is connected to an interconnecting node between the first and second sub-circuits, and
wherein one or more inputs of the feedback sub-circuit are connected to one or more internal interconnection nodes of the second sub-circuit or configured to receive one or more control signals provided to the circuit arrangement.

14. The circuit arrangement as claimed in claim 13, wherein the plurality of sub-circuits further comprise a third sub-circuit, and
wherein an input and an output of the third sub-circuit are connected to an output of the second sub-circuit.

15. The circuit arrangement as claimed in claim 13, wherein the feedback sub-circuit comprises a pair of stacking transistors of one conductivity type and a pair of non-stacking transistors of the opposite conductivity type.

16. The circuit arrangement as claimed in claim 15, wherein, for each transistor of the pair of stacking transistors and the pair of non-stacking transistors, the transistor is configured to drive a load associated with the transistor and has an aspect ratio that is sized larger than a transistor that is optimized for driving the load.

17. The circuit arrangement as claimed in claim 16, wherein the aspect ratio is at least 2.5.

18. The circuit arrangement as claimed in claim 13, wherein the circuit arrangement is a sequential logic circuit arrangement.

19. A circuit arrangement comprising:
a plurality of sub-circuits electrically coupled to each other, wherein each sub-circuit of the plurality of sub-circuits comprises:
a first set of transistors configured to receive one or more input signals provided to the sub-circuit; and
a second set of transistors electrically coupled to each other, wherein the second set of transistors is configured to provide one or more output signals of the sub-circuit,
wherein the first set of transistors and the second set of transistors are electrically coupled to each other,
wherein, for each transistor of the first set of transistors and the second set of transistors, the transistor is configured to drive a load associated with the transistor and has an aspect ratio that is sized larger than an aspect ratio of a transistor that is optimized for driving the load, and
wherein the plurality of sub-circuits comprise:
a first sub-circuit and a second sub-circuit,
wherein an input and an output of the second sub-circuit are connected to an output of the first sub-circuit.

20. A circuit arrangement comprising:
a plurality of sub-circuits electrically coupled to each other, wherein each sub-circuit of the plurality of sub-circuits comprises:
a first set of transistors configured to receive one or more input signals provided to the sub-circuit; and a second set of transistors electrically coupled to each other, wherein the second set of transistors is configured to provide one or more output signals of the sub-circuit, wherein the first set of transistors and the second set of transistors are electrically coupled to each other, wherein, for each transistor of the first set of transistors and the second set of transistors, the transistor is configured to drive a load associated with the transistor and has an aspect ratio that is sized larger than an aspect ratio of a transistor that is optimized for driving the load, and wherein the plurality of sub-circuits comprise:

a first sub-circuit, a second sub-circuit, a third sub-circuit and a fourth sub-circuit, wherein an input and an output of the second sub-circuit are connected to an output of the first sub-circuit and to an input of the third sub-circuit, and wherein an input and an output of the fourth sub-circuit are connected to an output of the third sub-circuit.

* * * * *